United States Patent
Iwase

(10) Patent No.: US 7,613,537 B2
(45) Date of Patent: Nov. 3, 2009

(54) METHOD AND SYSTEM OF RECOGNIZING ID MARKS APPENDED ON BASE MATERIALS, AND METHOD OF MANUFACTURING PRODUCTS BY BASE MATERIALS WITH THE ID MARKS

(75) Inventor: Masao Iwase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 470 days.

(21) Appl. No.: 11/037,301

(22) Filed: Jan. 19, 2005

(65) Prior Publication Data
US 2005/0213458 A1    Sep. 29, 2005

(30) Foreign Application Priority Data
Jan. 20, 2004    (JP)    ............ P2004-011812

(51) Int. Cl.
*G06F 19/00* (2006.01)
(52) U.S. Cl. ............ 700/115; 235/462.1; 714/784
(58) Field of Classification Search ............ 700/96, 700/103, 115–116, 125, 171, 213, 215, 222–227, 700/121; 283/70; 235/462.01, 462.08, 454, 235/462.05, 462.09, 462.1, 462.11, 494, 235/254; 136/200, 243, 252; 375/254; 382/232–238; 438/14, 16; 707/5–7, 104.1; 714/42, 752–762, 714/774–794
See application file for complete search history.

(56) References Cited

U.S. PATENT DOCUMENTS 4,922,508 A * 5/1990 Moriya ............ 375/254
5,118,369 A * 6/1992 Shamir ............ 156/64
5,350,988 A * 9/1994 Le ............ 318/618
5,414,689 A * 5/1995 Maeda et al. ............ 369/59.11
5,917,945 A * 6/1999 Cymbalski ............ 382/192

(Continued)

FOREIGN PATENT DOCUMENTS

JP    2002-353080    12/2002

OTHER PUBLICATIONS

U.S. Patent Application of Tsunetoshi Arikado et al., for "Semiconductor Wafer with ID Mark, Equipment for and Method of Manufacturing Semiconductor Device from them", U.S. Appl. No. 10/101,337, filed Mar. 20, 2002.

(Continued)

*Primary Examiner*—Kidest Bahta
*Assistant Examiner*—Carlos Ortiz Rodriguez
(74) *Attorney, Agent, or Firm*—Finnegan, Henderson, Farabow, Garrett & Dunner, L.L.P.

(57) ABSTRACT

A method of recognizing ID marks encompasses reading the ID marks appended on base materials, and converting the ID marks into bit data; identifying the converted bit data with one of original bit data, when deterioration of the ID mark is within an error correction ability; specifying the converted bit data as damaged data, when the deterioration of the ID mark is beyond the error correction ability; comparing candidate original data with the damaged data and calculates the concordance ratios, the candidate original data is an original bit data not identified by the converted bit data; conjecturing one of candidate original data having the highest concordance ratio as the conjectured bit data of the subject damaged data; and judging whether the conjectured bit data can be adopted as a true bit data for the damaged data.

20 Claims, 13 Drawing Sheets

U.S. PATENT DOCUMENTS

| | | | |
|---|---|---|---|
| 6,003,144 A * | 12/1999 | Olarig et al. | 714/42 |
| 6,218,199 B1 * | 4/2001 | Sato | 438/14 |
| 6,244,764 B1 * | 6/2001 | Lei et al. | 400/103 |
| 6,381,369 B1 * | 4/2002 | Kondo | 382/238 |
| 6,550,685 B1 * | 4/2003 | Kindberg | 235/494 |
| 6,598,200 B1 * | 7/2003 | Greenwood et al. | 714/774 |
| 6,629,639 B2 * | 10/2003 | Bengala | 235/454 |
| 6,722,565 B2 * | 4/2004 | Takeuchi et al. | 235/454 |
| 6,726,104 B2 * | 4/2004 | Schuessler et al. | 235/462.09 |
| 6,918,539 B2 * | 7/2005 | Nakajima et al. | 235/454 |
| 6,959,226 B2 * | 10/2005 | Hsieh | 700/115 |
| 7,031,791 B1 * | 4/2006 | Chang | 700/121 |
| 7,107,506 B2 * | 9/2006 | Reichenbach | 714/758 |
| 2003/0009725 A1 * | 1/2003 | Reichenbach | 714/804 |
| 2006/0236202 A1 * | 10/2006 | Reichenbach | 714/758 |

OTHER PUBLICATIONS

U.S. Patent Application of Masao Iwase et al., for "Semiconductor Wafer and a Method for Manufacturing a Semiconductor Wafer", U.S. Appl. No. 10/687,705, filed Oct. 20, 2003.

* cited by examiner

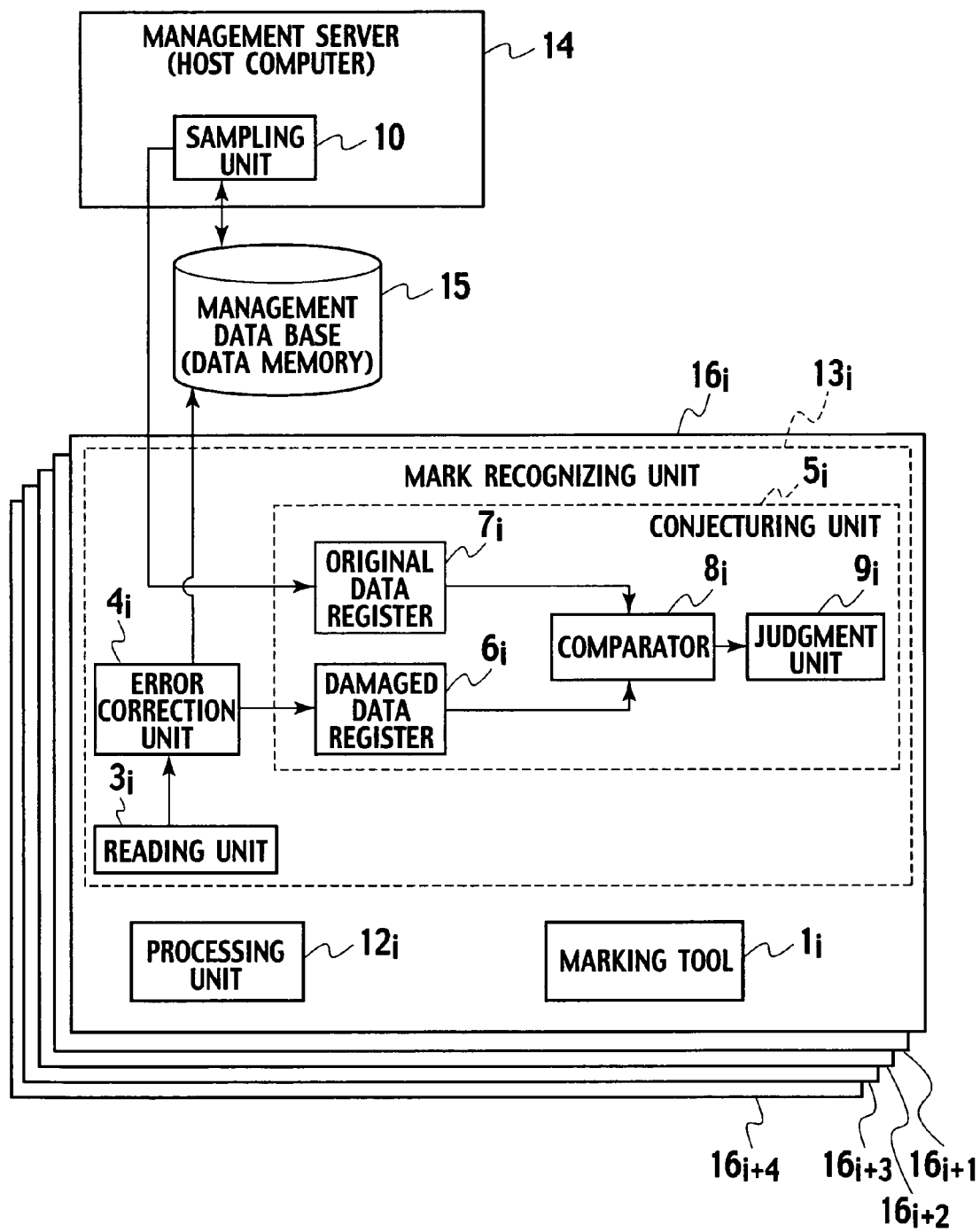

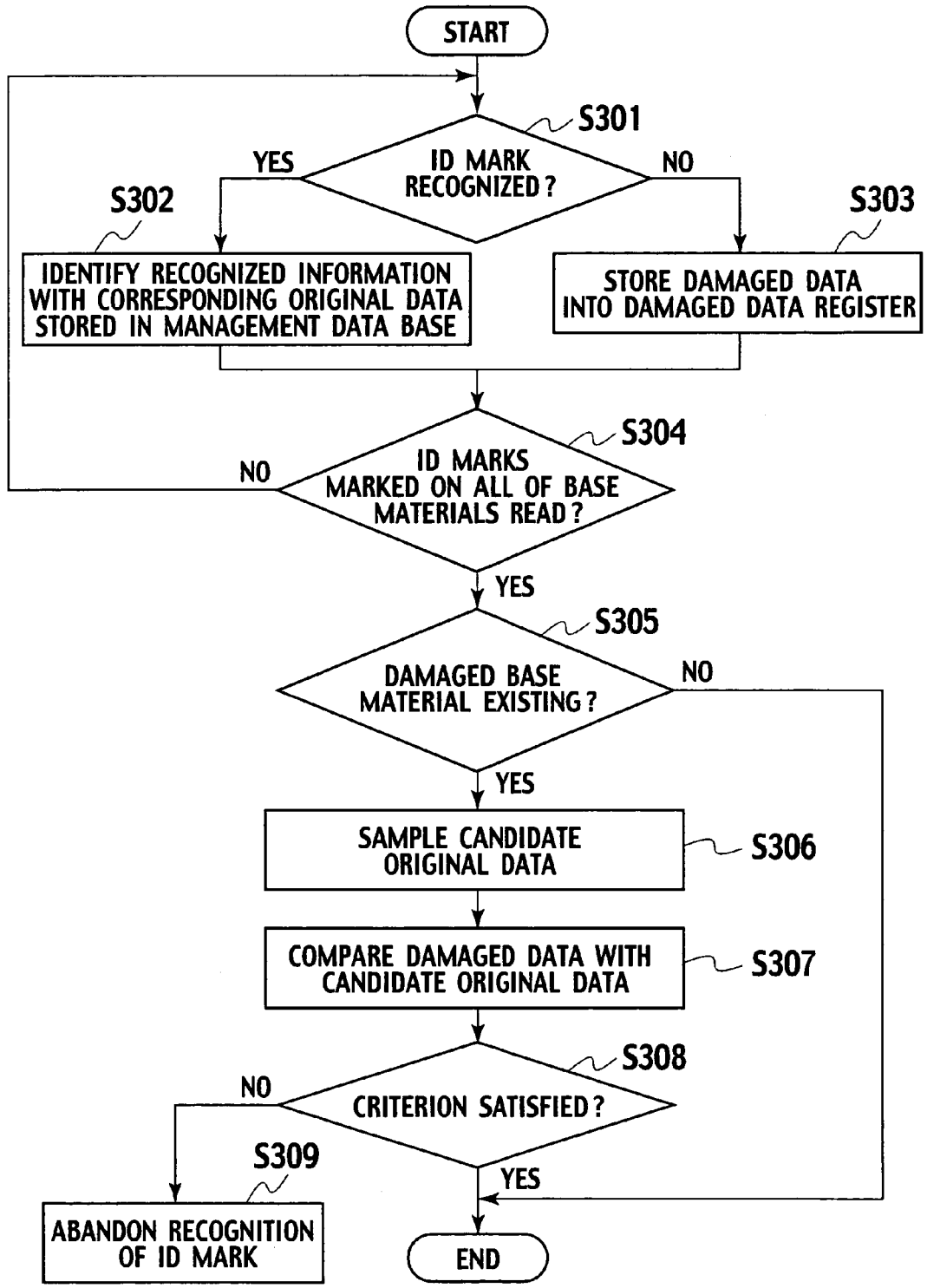

FIG. 5

|  | 1ST CANDIDATE ORIGINAL DATA | 2ND CANDIDATE ORIGINAL DATA | 3RD CANDIDATE ORIGINAL DATA |
|---|---|---|---|
| DAMAGED DATA A | 70% | 65% | 63% |
| DAMAGED DATA B | 68% | 67% | 69% |
| DAMAGED DATA C | 69% | 70% | 63% |

FIG. 6

|  | BASE MATERIAL #1(a) | BASE MATERIAL #2-#25(b) | (a)-(b) | JUDGMENT (OK/NG) |
|---|---|---|---|---|
| 1ST | 60% | 63% | -3% | NG |
| 2ND | 57% | 64% | -7% | NG |
| 3RD | 75% | 63% | 12% | OK |
| 4TH | 79% | 68% | 11% | OK |
| 5TH | 56% | 63% | -7% | NG |
| 6TH | 78% | 62% | 16% | OK |
| 7TH | 76% | 63% | 13% | OK |
| 8TH | 75% | 67% | 8% | OK |
| 9TH | 78% | 64% | 14% | OK |
| 10TH | 75% | 62% | 13% | OK |

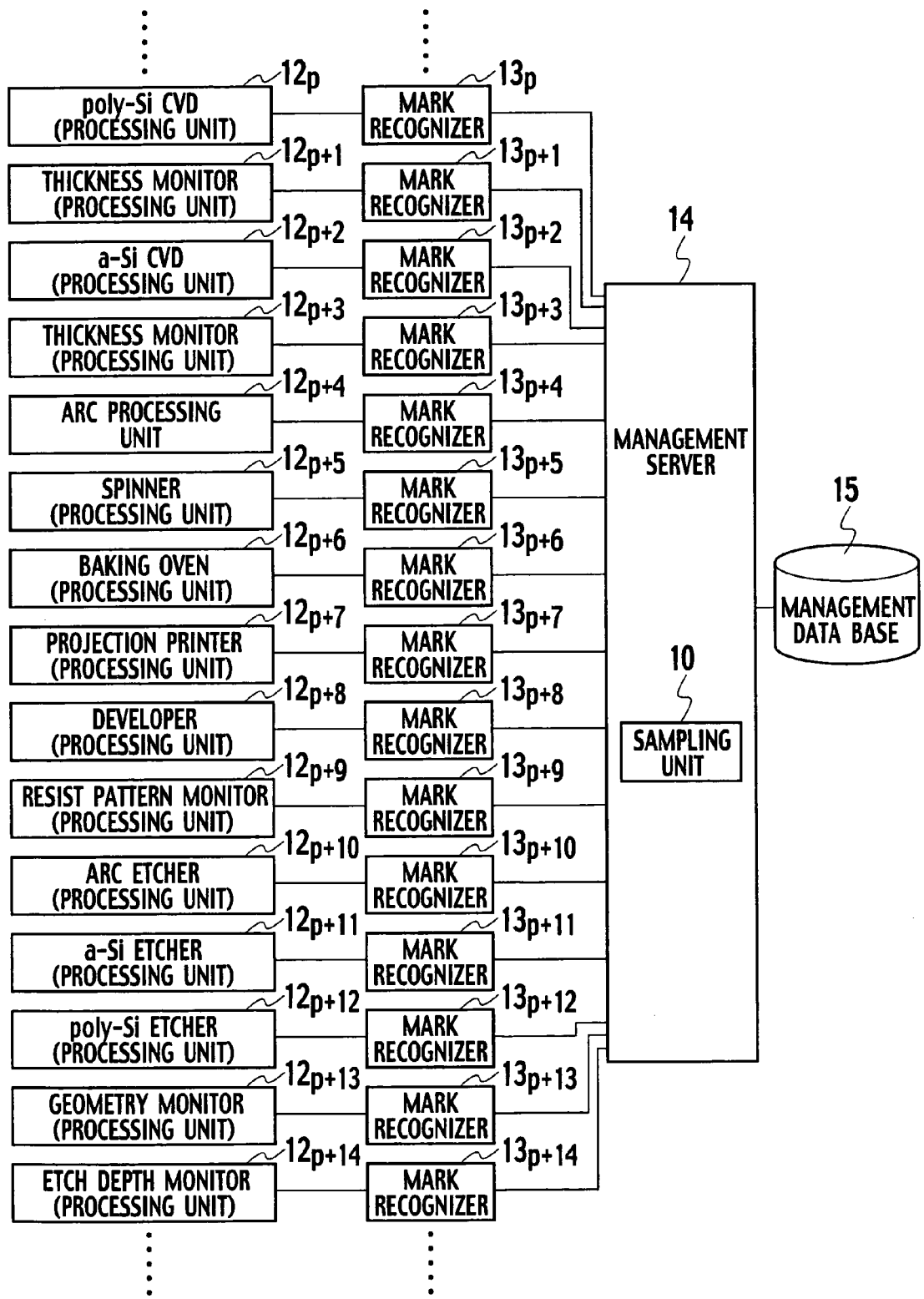

US 7,613,537 B2

METHOD AND SYSTEM OF RECOGNIZING ID MARKS APPENDED ON BASE MATERIALS, AND METHOD OF MANUFACTURING PRODUCTS BY BASE MATERIALS WITH THE ID MARKS

CROSS REFERENCE TO RELATED APPLICATIONS AND INCORPORATION BY REFERENCE

This application claims benefit of priority under 35 USC 119 based on Japanese Patent Application No. P2004-11812 filed Jan. 20, 2004, the entire contents of which are incorporated by reference herein.

BACKGROUND OF THE INVENTION

1. Field of the Invention

The present invention relates to a method of recognizing identity marks (ID marks) appended on each of a plurality of base materials, a system configured to recognize ID marks appended on the base materials, and a method of manufacturing products by the base materials appended with the ID marks.

2. Description of the Related Art

Usually, in a planned sequence of production processes of a semiconductor device, there are as many as several hundred processes where control of manufacturing conditions and the like are required. In such manufacturing processes of the semiconductor device, various and strict manufacturing conditions must be specified in each manufacturing process. Each of these manufacturing processes is controlled using an ID mark provided on part of a principal side of a semiconductor wafer, including numerals, characters, bar codes, etc.

In recent years, a two-dimensional code implemented by dot marks has been appended as an ID mark on a semiconductor wafer, because the two-dimensional code has a larger data storage capacity than a one-dimensional code, although the marking area required for the two-dimensional code is small, and the two-dimensional code can be formed easily on the semiconductor wafer by a laser delineation technique etc.

A recognizer of the two-dimensional code is adopted for a code recognizer. The code recognizer has an error correction ability by the Reed-Solomon architecture, by which the code recognizer can correct a deteriorated ID mark, in which about 20% to 30% of the ID mark is deteriorated. When recognizing a deteriorated ID mark, the Reed-Solomon architecture rarely makes a mistake in the case where the deteriorated level lies within a range that the error correction ability of the code recognizer can cover.

In U.S. patent application Ser. No. 10/101,337, a method for controlling a sequence of production processes of a semiconductor device is disclosed using an ID mark implemented by a two-dimensional code engraved on a beveled contour of a semiconductor wafer, and by reading the ID mark in each manufacturing process. In U.S. patent application Ser. No. 10/101,337, a plurality of ID marks implemented by two-dimensional dots, which are engraved unevenly on a portion of the beveled contour disposed, are successively added at the perimeter of a notch in the semiconductor wafer along with the proceeding of the process sequence. Then the newest ID mark or all of the ID marks are read by an ID mark recognizing unit, and according to the information on the newest ID mark or all of the ID marks, the semiconductor wafer is processed.

However, in manufacturing processes of a semiconductor device, since an ID mark passes through repeated processes including deposition process of thin films such as insulating film and removal processes such as chemical mechanical polishing (CMP) of the thin films, attachment of particles and damage to dots and the like occur in a certain area of the ID mark or sometimes in a large area over 30% of the ID mark is deteriorated.

In such a case where damage to the ID mark occurs, and exceeds the limit of the error correction ability of the ID mark recognize unit, there is no alternative measure to amend the damage, therefore the ID mark is judged as "illegible" by the ID mark recognizing unit. The semiconductor wafer including the ID mark which was judged as "illegible" has no way but to be removed from the manufacturing line, since the semiconductor wafer with the illegible ID mark can not identify the manufacturing number or the manufacturing process, which results in a decrease in manufacturing yield.

A problem similar to the one mentioned above in the manufacturing method of a semiconductor device occurs in such manufacturing methods where liquid crystal device, magnetic recording medium, optic recording medium, thin film magnetic head, and superconductor elements are manufactured.

SUMMARY OF THE INVENTION

An aspect of the present invention may inhere in a method of recognizing ID marks, encompassing reading each of the ID marks appended on a plurality of base materials, and converting the ID marks into bit data, respectively; identifying each of the converted bit data with one of original bit data, when deterioration of the ID mark is within an error correction ability; specifying the converted bit data of each of the ID marks as damaged data, when the deterioration of the ID mark is beyond the error correction ability; comparing bit by bit each of the damaged data with candidate original data, each of the candidate original data is an original bit data that is not identified by the converted bit data, and calculates each of the concordance ratios between the damaged data and the candidate original data; conjecturing one of candidate original data as a conjectured bit data for each of the damaged data under a paramount-criterion, which conjecture a candidate original data having the highest concordance ratio against to a subject damaged data as the conjectured bit data of the subject damaged data; and judging whether the conjectured bit data can be adopted as a true bit data for each of the damaged data under a subsidiary-criterion, which is different from the paramount-criterion.

Another aspect of the present invention may inhere in a system of recognizing ID marks, encompassing a reading unit configured to read each of the ID marks appended on a plurality base materials, and to convert the ID marks into bit data, respectively; an error correction unit configured to correct the converted bit data into normal bit data when deterioration of the ID mark is within an error correction ability, to specify the converted bit data as damaged data, when the deterioration of the ID mark is beyond the error correction ability; a host computer having a sampling unit configured to sample candidate original data among original bit data of the ID marks, by identifying the converted bit data with one of the original bit data, each of the candidate original data is an original bit data that is not identified by the converted bit data; a comparator configured to compare bit by bit candidate original data with each of the damaged data, to calculate each of the concordance ratios between the candidate original data and the damaged data and to conjecture one of candidate original data having the highest concordance ratio against to a subject damaged data as the conjectured bit data of the subject damaged data; and a judgement unit configured to judge whether the conjectured bit data can be adopted as a true bit data for each of the subject damaged data.

Still another aspect of the present invention may inhere in a method of manufacturing products, encompassing appending first ID marks on respective unprocessed sites on a plurality of base materials; storing each of original bit data of the first ID marks appended on all of the base materials in a management data base of a host computer; executing a subject process on all of the base materials; reading each of the first ID marks appended on the base materials after the subject process, converting the first ID marks into bit data, respectively, identifying the converted bit data of each of the first ID marks with one of original bit data, when deterioration of the first ID mark is within an error correction ability, specifying the converted bit data of each of the first ID marks as damaged data, when the deterioration of the first ID mark is beyond the error correction ability, comparing bit by bit candidate original data with each of the damaged data and calculates each of the concordance ratios between the candidate original data and the damaged data, each of the candidate original data is an original bit data that is not identified by the converted bit data, and conjecturing one of candidate original data as a conjectured bit data for each of the damaged data under a paramount-criterion, which conjecture a candidate original data having the highest concordance ratio against to a subject damaged data as the conjectured bit data of the subject damaged data; and generating a second ID mark based upon the conjectured bit data and appending the second ID mark adjacent the first ID mark on the base material, which generated the damaged data; and executing a next process of the subject process on all of the base materials.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 1A is an illustrative block diagram of part of an ID mark recognition system, especially showing a configuration of one of manufacturing machines implementing the ID mark recognition system, according to a first embodiment of the present invention;

FIG. 4 is a flowchart illustrating a sequence of process flows implementing the recognition method of the ID mark of the base material according to the first embodiment of the present invention;

FIG. 5 is a table showing each of the concordance ratios, comparing the first candidate original data, the second candidate original data and the third candidate original data with the damaged data A, the damaged data B and the damaged data C, respectively;

FIG. 6 is a table showing an experimental result of concordance ratios between damaged data and candidate original data, which were obtained by varying damages so that the given damages changes in ten different levels;

FIG. 10 is an illustrative block diagram showing part of an ID mark recognition system according to a second embodiment of the present invention.

DETAILED DESCRIPTION OF THE INVENTION

Figure 1B:
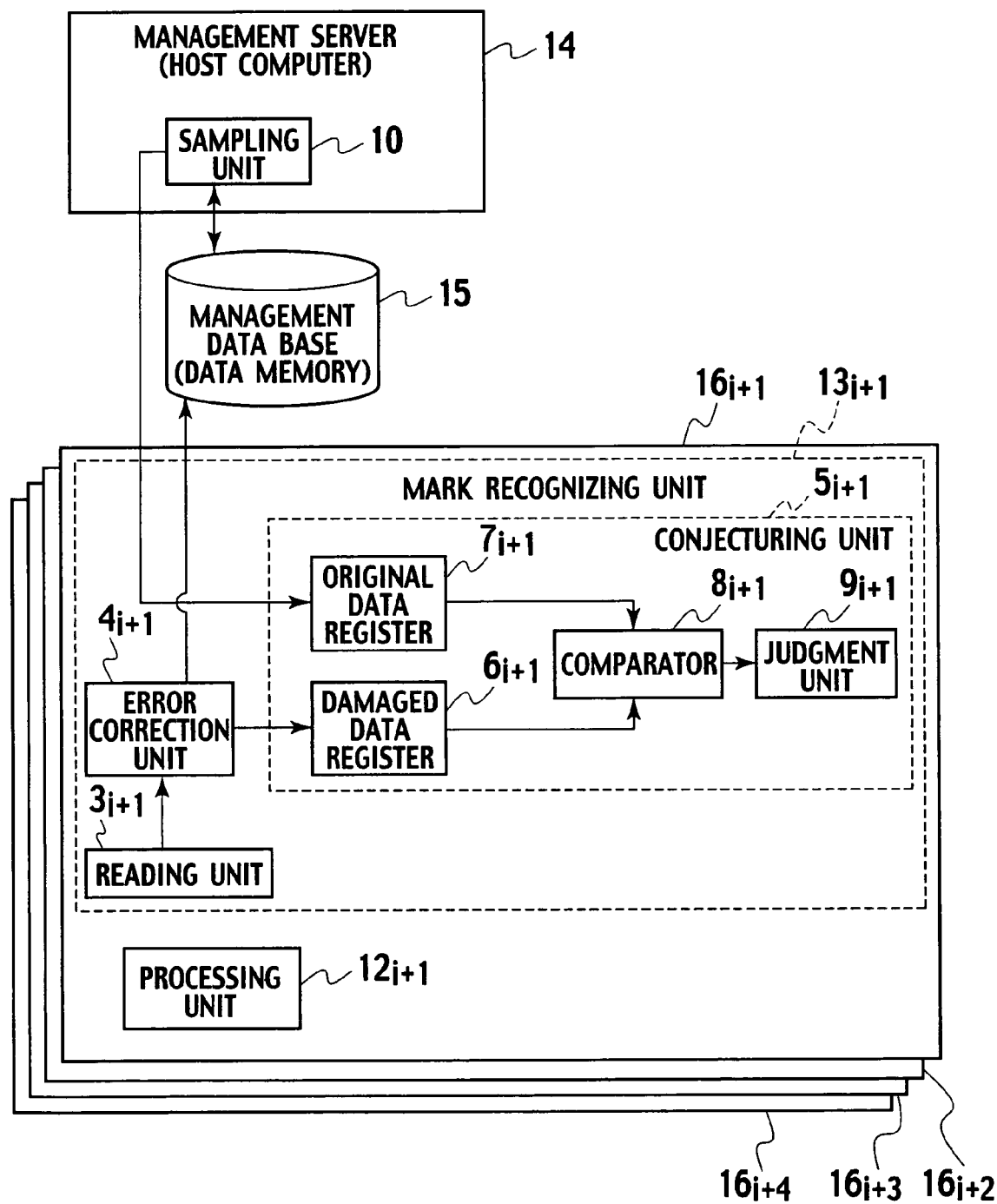
FIG. 1B is an illustrative block diagram showing a configuration of another manufacturing machine in the ID mark recognition system shown in FIG. 1A.

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention.

Prepositions, such as "on", "over", "under", "beneath", and "normal" are defined with respect to a planar surface of the substrate, regardless of the orientation in which the substrate is actually held. A layer is on another layer even if there are intervening layers.

FIRST EMBODIMENT

Generic Embodiment

A first embodiment of the present invention relates to a manufacturing method in which base materials are processed in a planned sequence of production processes, assigning a plurality of base materials as one lot, and through the planned sequence of production processes, products (industrial products) are manufactured on a part of each of the base materials, or alternatively on the surface of each of the base materials. The first embodiment of the present invention especially pertains to a recognition method of an ID mark formed on a part of the base materials, a recognition system of the ID mark and a manufacturing method in which industrial products are processed using the recognition method. Here, the base materials may include various substrates such as semiconductor substrates (semiconductor wafers) for manufacturing semiconductor devices, liquid crystal substrates for manufacturing liquid crystal devices, resin substrates for manufacturing magnetic recording media and optical recording media, magnetic material substrates for manufacturing thin film magnetic heads, piezoelectric material substrates for manufacturing ultrasonic elements, superconductor material substrates for manufacturing superconductor elements etc, on which products are manufactured so as to provide a unprocessed site on each of the substrates which keeps original surface morphology during most of the manufacturing processes, while other parts of each of the substrates are selectively processed to manufacture required products. For the base materials, various organic based materials such as synthetic resins and various inorganic based materials such as semiconductors, metals, ceramics and glasses are acceptable, depending on the purposes of respective manufacturing. Most of the base materials may be formed into plate-like configurations such as a semiconductor wafer, which are called "manufacturing substrates". However, the geometry of the base materials is not limited to the plate-like configurations, and various geometries including a block configuration can be adopted according to the purpose of manufacturing.

As shown in FIG. 1A, an ID mark recognition system of the first embodiment is established in a mass production factory in which products are manufactured in a planned sequence of production processes, and the recognition system encompasses a plurality of manufacturing machines $16_i$, $16_{i+1}$, $16_{i+2}$, $16_{i+3}$, $16_{i+4}$, ... and a management server (host computer) 14 for controlling the manufacturing machines $16_i$, $16_{i+1}$, $16_{i+2}$, $16_{i+3}$, $16_{i+4}$, ....

The management server (host computer) 14 embraces a function of a manufacturing execution system (MES) server and can be implemented by a plurality of systems for controlling a plant, which connect between a business system of an enterprise resource planning (ERP) package at headquarters and a group of control systems which control the operation of respective machines for manufacturing filed. Therefore, although an illustration is omitted, a plurality of manufacturing machines $16_i$, $16_{i+1}$, $16_{i+2}$, $16_{i+3}$, $16_{i+4}$, ... are connected to the management server (host computer) 14 through local-area network (LAN) of the MES. Individual specific instructions (job instructions) can be transmitted to the manufacturing machines $16_i$, $16_{i+1}$, $16_{i+2}$, $16_{i+3}$, $16_{i+4}$, ... from the management server (host computer) 14 which has the function of the MES server. Note that, although a single management server (host computer) 14 is illustrated in FIG. 1A, a plurality of controlling servers may physically exist for controlling a plurality of manufacturing machines.

The management server (host computer) 14 includes a management data base (data memory) 15 and a sampling unit 10 so that the management server 14 can control each of the manufacturing processes, each of which is established by the corresponding manufacturing machines $16_i$, $16_{i+1}$, $16_{i+2}$, $16_{i+3}$, $16_{i+4}$, ... so as to manufacture subject products (industrial products). The management data base (data memory) 15 stores original bit data (hereinafter may be referred to simply as "original data") establishing the ID marks to be appended to one lot of the base materials, which are processed sequentially by the corresponding manufacturing machines $16_i$, $16_{i+1}$, $16_{i+2}$, $16_{i+3}$, $16_{i+4}$, .... All of the origin data of the ID marks for one lot are transmitted from a marking tool $1_i$ and stored in the management data base (data memory) 15 before a planned sequence of production processes of products (industrial products) begin. When the ID marks are already appended to the base materials by producer (producing company) or supplier (supplying company), the ID marks for one lot are read by a mark recognizing unit and stored in the management data base 15 before the planned sequence of production processes begin.

The sampling unit 10 in the management server (host computer) 14 identifies the converted bit data of the ID mark, transmitted from the manufacturing machines $16_i$, $16_{i+1}$, $16_{i+2}$, $16_{i+3}$, $16_{i+4}$, ... with corresponding original data of one lot of the base materials which are stored in the management data base (data memory) 15. The sampling unit 10 samples the remnant original data, which can not be identified with the converted bit data of the ID mark transmitted from the manufacturing machines $16_i$, $16_{i+1}$, $16_{i+2}$, $16_{i+3}$, $16_{i+4}$, ..., and they are defined as "candidate original data".

Here, because the "ID mark" is formed so as to recognize each of the base materials, the ID mark manifests such information as a lot number corresponding to products, base material number within the lot, manufacturing conditions such as manufacturing order, processing history of the products and inspection results of the products. In addition, the following may be included for information on the ID mark sampling frequency of operation management data, corresponding process names, recipe names of the corresponding processes, equipment names for the corresponding processes, ID numbers of the jobs by the corresponding equipment, module names of the corresponding equipment and the corresponding chamber names. Using the ID mark, whether the products are processed or not, the manufacturing conditions are decided by each process in a planned sequence of production processes. Various codes including character code such as alphanumeric character and image codes such as figures, a one-dimensional code, a two dimensional code and a combination code of a one-dimensional code and a two dimensional code are acceptable for the "ID mark". Also an intermediate code between a one-dimensional code and a two dimensional code, which is known as "a stacked bar code" and the like, in which a bar code (one-dimensional code) is stacked two-dimensionally, are useable for the ID mark. However, a two dimensional code is preferable in respect to the information quantity per unit area. Hereinafter, though the kind of code is not limited to the two-dimensional code and an explanation will be made in regard to a case where the two-dimensional code is used as an ID mark as long as the kind of code is not specially designated. The ID mark is usually engraved unevenly on an unprocessed site of the base materials. Here, "the unprocessed site of the base materials" includes an outer peripheral part of the base materials which is not intentionally processed, for example, in the case where the base material is a plate-like substrate, an outer peripheral part on the top surface of the plate-like substrate, a lateral face of the plate-like substrate and an outer peripheral part on the bottom surface of the plate-like substrate, in which products (industrial products) are not manufactured, are applicable for "the unprocessed site of the base materials".

For instance, in a case of manufacturing a semiconductor device, "the unprocessed site of the base materials" is an unprocessed site of a semiconductor wafer. More concretely, a lateral face such as a beveled contour (first beveled contour) 43a of a semiconductor wafer 42 as shown in FIG. 8A and an outer peripheral part of a bottom surface 42b of the semiconductor wafer 42 as shown in FIG. 9A can be used for "the unprocessed site of the base materials".

Figure 2A:
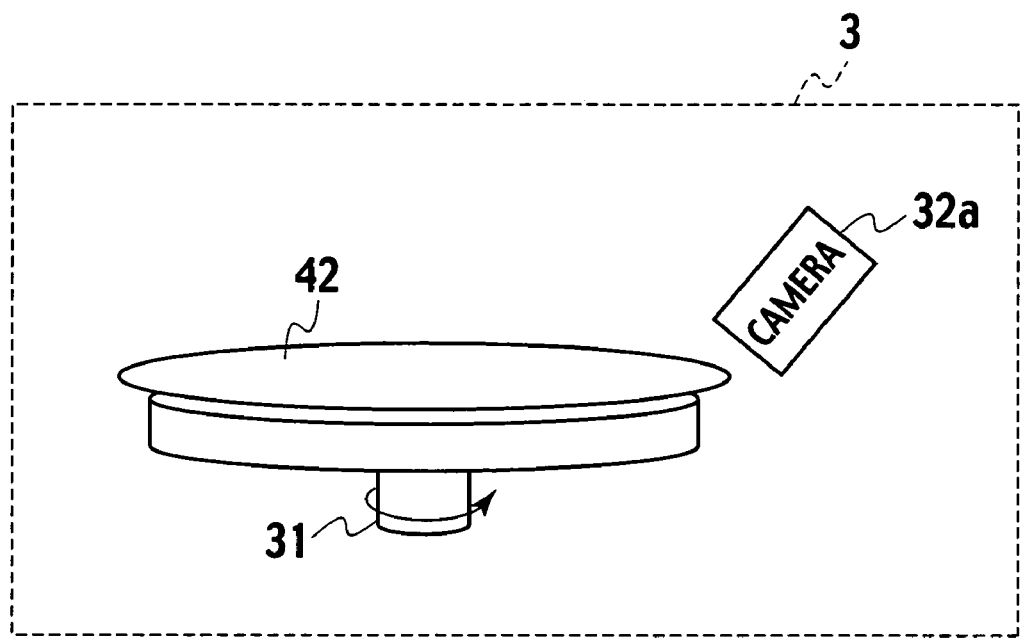
FIG. 2A is a schematic bird's-eye view illustrating an example of a reading unit in a mark recognizing unit implementing the ID mark recognition system of the first embodiment.
Figure 8A:
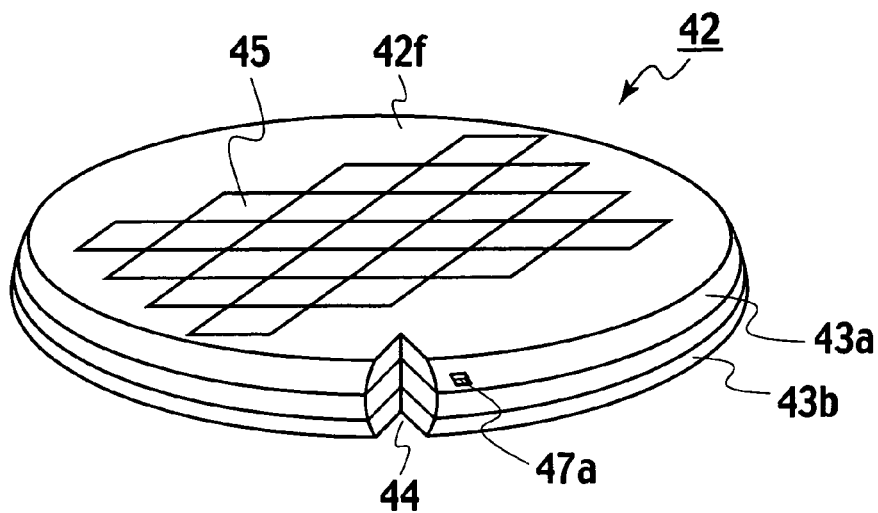
FIG. 8A is a schematic bird's-eye view illustrating a configuration in which a first ID mark is appended on an upper lateral face, or the first beveled contour of a semiconductor wafer.

The semiconductor wafer 42b shown in FIG. 8A is a disc-like configuration defined by a first principal surface (top surface) 42f and a second principal surface (bottom surface) 42b opposing to the first principal surface (top surface) 42f. The perimeter of the top surface 42f has a first beveled contour 43a and the perimeter of the bottom surface 42b has a second beveled contour 43b for each. An inclination angle of the first beveled contour 43a to the top surface 42f is, for instance, about twenty-two degrees, and an inclination angle of the second beveled contour 43b to the bottom surface 42b is about twenty-two degrees as well, corresponding to the inclination angle of the first beveled contour 43a. A plurality of chip areas 45 are arranged on the surface of the top surface 42f. Within each of the chip areas 45, a pattern of a semiconductor integrated circuit as a product (industrial product) is delineated. In a part of the outer peripheral part of the semiconductor wafer 42b, a notch 44 configured to show a reference position is established. An ID mark 47a is appended on the first beveled contour 43a. The ID mark 47a is preferably formed within approximately 10 mm from the notch 44. The distance is not particularly limited to 10 mm. However, if the ID mark 47a is formed close to the notch 44, as shown in FIG. 2A, since the object base material (semiconductor wafer) 42 is chucked on an object stage (wafer stage) 31 and the object stage (wafer stage) 31 is rotated relatively toward a photoelectric transducer 32 for reading the ID mark 47a, movement time of the photoelectric transducer 32 for visually recognizing the ID mark 47a can be shortened.

Figure 9A:
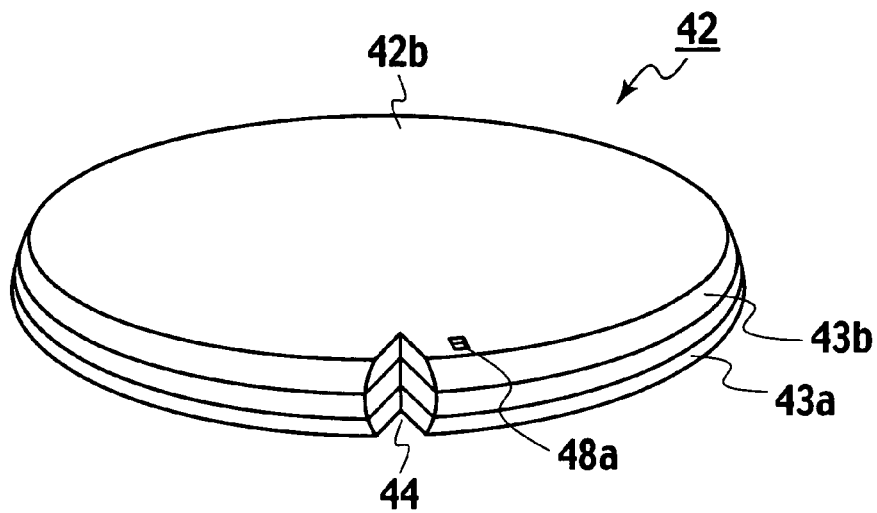
FIG. 9A is a schematic bird's-eye view illustrating another configuration in which a first ID mark is appended on an outer peripheral part of a bottom surface of a semiconductor wafer.

FIG. 9A shows a configuration corresponding to a reverse side of FIG. 8A. In FIG. 9A, the ID mark 48a is appended at the perimeter of the notch 44, formed on a peripheral part of the second principal surface (bottom surface) 42b. Note that besides the examples shown in FIGS. 8A and 9A, the ID mark may well be formed on "the unprocessed site of the base materials" on the outer peripheral part of the top surface of the first principal surface 42f of the semiconductor wafer 42, where patterns of a semiconductor integrated circuit as products (industrial products) are not delineated.

Figure 3A:
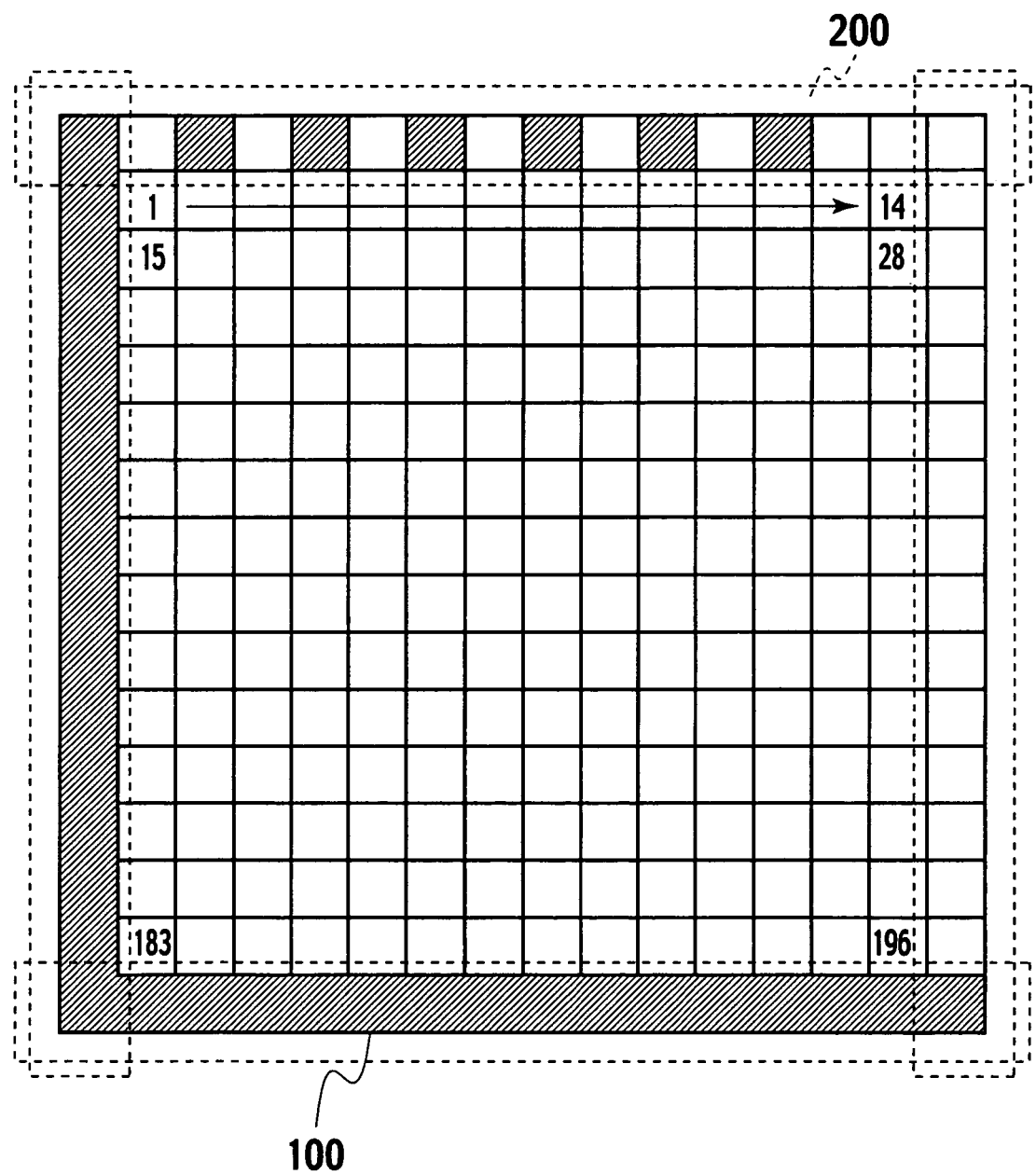
FIG. 3A is a pattern illustrating an example of the two-dimensional code, or "data matrix" usable in an ID mark recognition method according to the first embodiment of the present invention.
Figure 3B:
FIG. 3B is a pattern illustrating another example of the two-dimensional code, or "quick response (QR) code" usable in the ID mark recognition method according to the first embodiment of the present invention.
Figure 3C:
FIG. 3C is a pattern illustrating still another example of the two-dimensional code, or "PDF417" usable in the ID mark recognition method according to the first embodiment of the present invention.
Figure 3D:
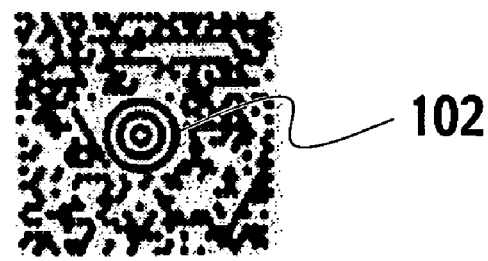
FIG. 3D is a pattern illustrating still another example of the two-dimensional code, or "Maxi code" usable in the ID mark recognition method according to the first embodiment of the present invention.
Figure 3E:
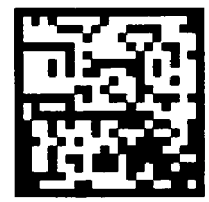
FIG. 3E is a pattern illustrating still another example of the two-dimensional code, or "Veri code" usable in the ID mark recognition method according to the first embodiment of the present invention.

"The two-dimensional code" includes various codes such as data matrix as shown in FIG. 3A, quick response (QR) code as shown in FIG. 3B, PDF417 as shown in FIG. 3C, Maxi code as shown in FIG. 3D and Veri code as shown in FIG. 3E.

Though FIG. 3A illustrates an example of Data matrix in which a two-dimensional code is used for an ID mark, usable two-dimensional codes for an ID mark is not limited to the data matrix. As shown in FIG. 3A, the ID mark (data matrix) embraces a square geometry implemented by two edges, forming a L character as a finder pattern (alignment pattern) 100 and by another two edges serving as a timing pattern (timing cells) 200, facing diagonal to the finder pattern (alignment pattern) 100, the timing pattern has rugged uneven patterns alternately arranged. The L-shaped finder pattern 100 is provided to distinguish which direction the data matrix is. By the timing pattern 200, cells of the data matrix are easy to be recognized. Namely, within the L-shaped finder pattern 100 and the timing pattern 200, the ID mark is engraved unevenly so as to record actual data. In FIG. 3A, a diagram in which sixteen by sixteen cells are arranged, is shown when the finder pattern 100 and the timing pattern 200 are included, however, an arrangement of eight by thirty two cells can be also acceptable for the configuration of the data matrix.

Still, in Maxi code shown in FIG. 3D, by establishing a quarry mark 102 of a three-fold circle in the center of the code, the position and reading direction of the code can be decided. And similar finder patterns (alignment patterns) are established in other two-dimensional codes, such that quarry marks 101a, 101b and 101c of square geometry are established in a quick response code as shown in FIG. 3B so as to detect an angle.

In the case where a semiconductor device is manufactured, a plurality of manufacturing machines $16_i$, $16_{i+1}$, $16_{i+2}$, $16_{i+3}$, . . . may include various semiconductor manufacturing tools, equipment or systems such as an ion implanter, diffusion equipment, thermal oxidation equipment for forming a silicone oxide film ($SiO_2$ film), chemical vapor deposition (CVD) equipment for depositing a $S_iO_2$ film, a phosphosilicate glass (PSG) film, a boron silicate glass (BSG) film, a boron phosphate-silicate glass (BPSG) film, a silicon nitride film ($Si_3N_4$ film), poly-silicon film etc., annealing equipment for reflow (melting) a PSG film, a BSG film, a BPSG film, etc., for densifying a CVD oxide film etc., and for forming a silicide film etc., a sputtering or a vacuum evaporating instrument for depositing a metallic film, plating equipment for plating a metallic film, CMP equipment for polishing a surface of a semiconductor substrate, dry and wet etching equipment for etching a surface of a semiconductor substrate, cleaning equipment for resist removal and cleaning by chemical solution, and a photolithography system encompassing exposure equipment such as a stepper and spin coat equipment (spinner). Further, in the manufacturing machines $16_i$, $16_{i+1}$, $16_{i+2}$, $16_{i+3}$, $16_{i+4}$, . . . , various inspection, testing and measuring equipment including an interference film thickness meter, an ellipsometer, a contact film thickness meter, a microscope and resistance measurement equipment are included. Also, the manufacturing machines $16_i$, $16_{i+1}$, $16_{i+2}$, $16_{i+3}$, $16_{i+4}$, . . . may include attached facilities such as water purifying equipment and gas purification equipment. The manufacturing machines $16_i$, $16_{i+1}$, $16_{i+2}$, $16_{i+3}$, $16_{i+4}$, . . . can also be applicable to both of batch processing equipment and single wafer processing equipment.

In FIG. 1A, an illustration is shown with respect to the machine $16_i$ among a plurality of manufacturing machines $16_i$, $16_{i+1}$, $16_{i+2}$, $16_{i+3}$, $16_{i+4}$, . . . . The machine $16_i$ may encompass a mark recognizing unit $13_i$, a processing unit $12_i$ and a marking tool $1_i$. The other manufacturing machines $16_{i+1}$, $16_{i+2}$, $16_{i+3}$, $16_{i+4}$, . . . may encompasses the mark recognizing unit $13_{i+1}$, $13_{i+2}$, $13_{i+3}$, $13_{i+4}$, . . . the processing unit $12_{i+1}$, $12_{i+2}$, $12_{i+3}$, $12_{i+4}$, . . . and the marking tool $1_{i+1}$, $1_{i+2}$, $1_{i+3}$, $1_{i+4}$, . . . as well as the manufacturing machine $16_i$.

However, it is not necessary for all of the manufacturing machines $16_i$, $16_{i+1}$, $16_{i+2}$, $16_{i+3}$, $16_{i+4}$, . . . encompass the marking tool. As shown in FIG. 1B, the manufacturing machine $16_{i+1}$ encompasses the mark recognizing unit $13_{i+1}$ and the processing unit $12_{i+1}$, but the marking tool. It may be enough that the marking tool is incorporated in a manufacturing machine which has a possibility to damage the ID mark. Although illustrations are omitted, the other manufacturing machine $16_{i+2}$, $16_{i+3}$, $16_{i+4}$, . . . may similarly encompass the mark recognizing unit $13_{i+2}$, $13_{i+3}$, $13_{i+4}$, . . . and the processing unit $12_{i+2}$, $12_{i+3}$, $12_{i+4}$, . . . but the incorporation of the marking tool is optional, because it depends on the extent to which the damage to the ID mark is generated.

Figure 1C:
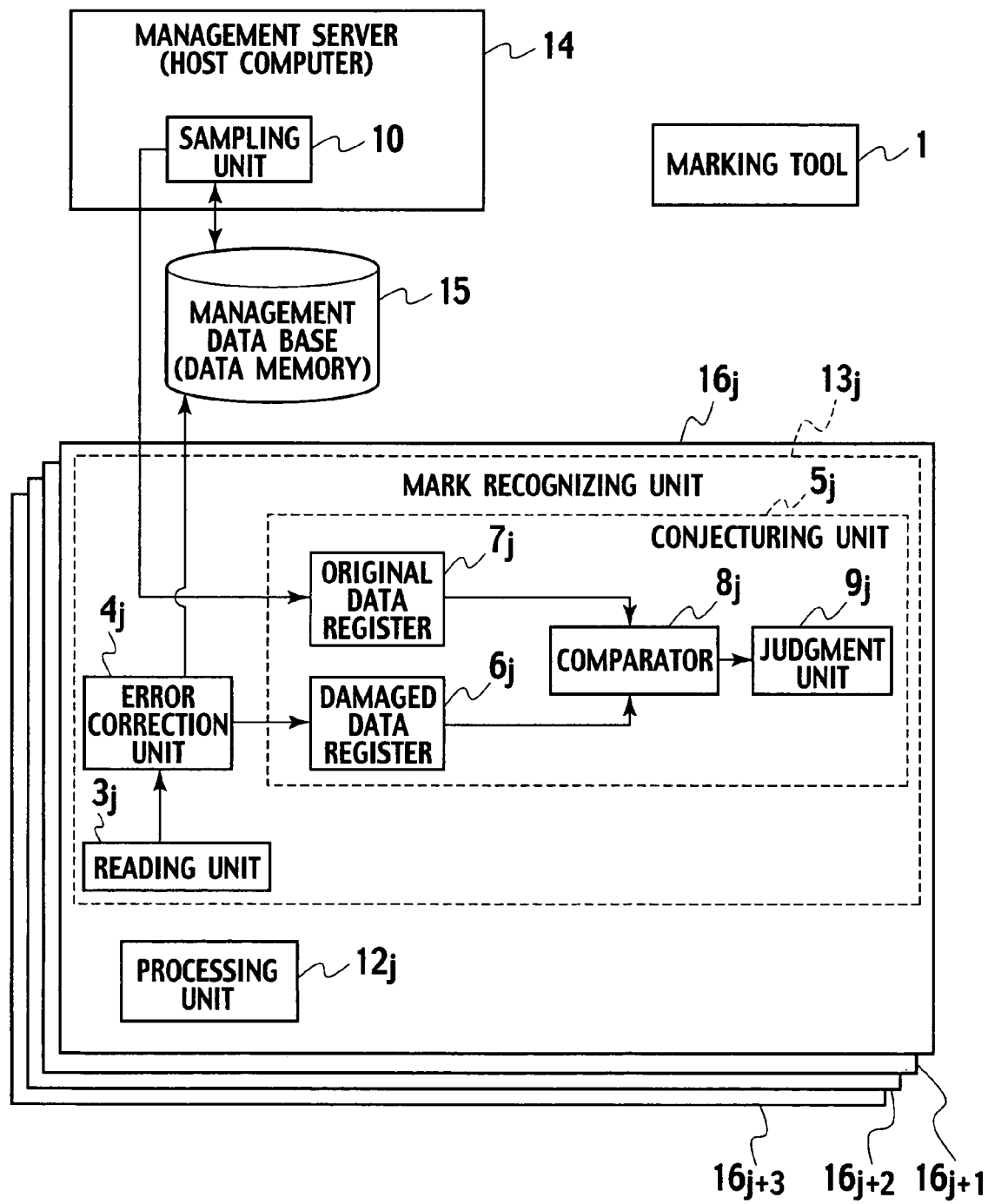
FIG. 1C is an illustrative block diagram showing another organization of an ID mark recognition system according to a modification of the first embodiment of the present invention.

On the contrary, as shown in FIG. 1C, manufacturing machines $16_j$, $16_{j+1}$, $16_{j+2}$, $16_{j+3}$, . . . may encompass the mark recognizing unit $13_j$, $13_{j+1}$, $13_{j+2}$, $13_{j+3}$, . . . the processing unit $12_j$, $12_{j+1}$, $12_{j+2}$, $12_{j+3}$, . . . , respectively, but the marking tool. Instead of encompassing the marking tools in each of the manufacturing machines $16_j$, $16_{j+1}$, $16_{j+2}$, $16_{j+3}$, . . . , a common marking tool 1 may be incorporated in an ID mark recognition system for the manufacturing machines $16_j$, $16_{j+1}$, $16_{j+2}$, $16_{j+3}$, . . . .

The processing unit $12_i$ performs corresponding actual processes by semiconductor manufacturing machines including the ion implanter, the diffusion equipment, the thermal oxidation equipment, the CVD equipment, the annealing equipment, the sputtering equipment, the vacuum evaporating equipment, the plating equipment, the CMP equipment, the dry and wet etching equipment, the cleaning equipment, the spinner and the exposure equipment. Thus, suppose that FIG. 1A shows a thermal oxidation equipment as the subject manufacturing machine $16_i$, a thermal oxidation furnace corresponds to the processing unit $12_i$ for the subject manufacturing machine $16_i$.

Figure 8B:
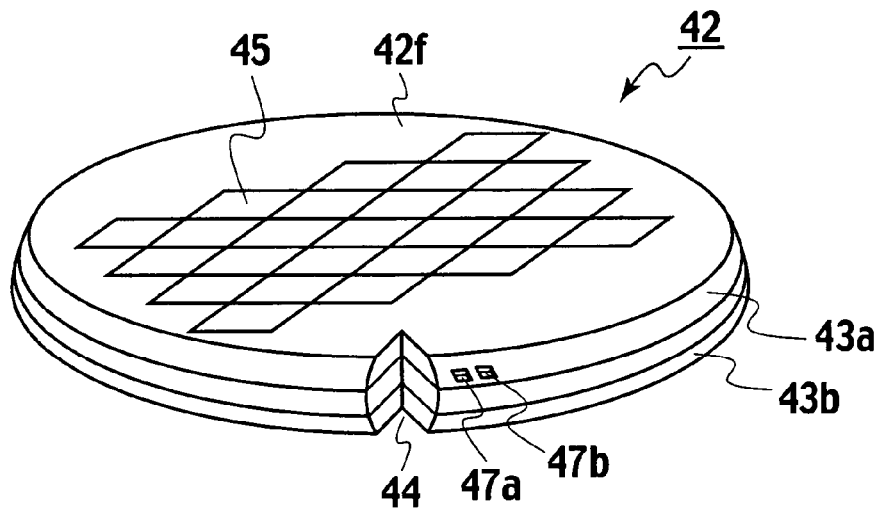
FIG. 8B is a schematic bird's-eye view illustrating a subsequent configuration in which a second ID mark is added at adjacent site of the first ID mark on the upper lateral face of the semiconductor wafer.
Figure 8C:
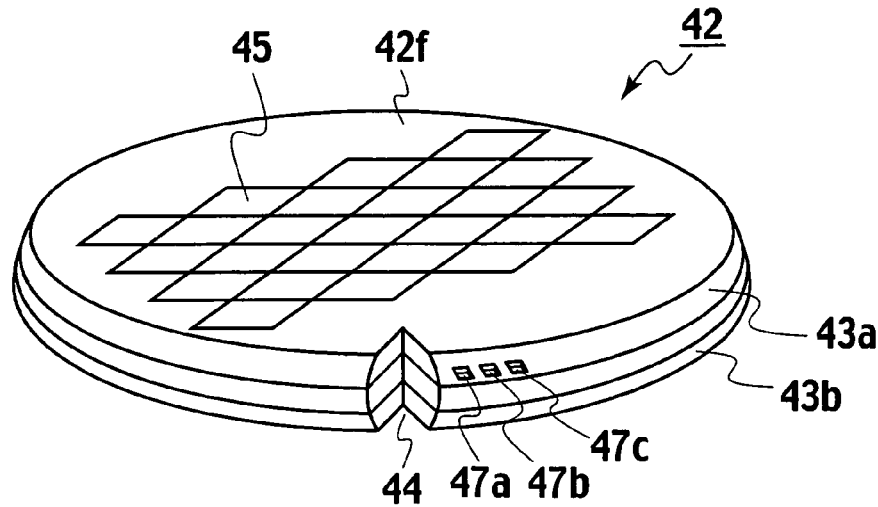
FIG. 8C is a schematic birds-eye view illustrating a further subsequent configuration in which a third ID mark is added at adjacent site of the second ID mark on the upper lateral face of the semiconductor wafer.
Figure 9B:
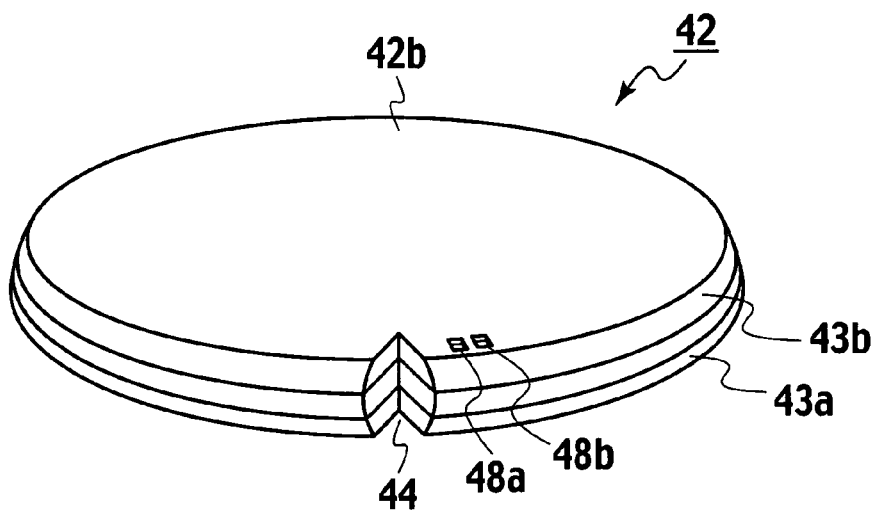
FIG. 9B is a schematic bird's-eye view illustrating a subsequent configuration in which a second ID mark is added at adjacent site of the first ID mark on the bottom surface of the semiconductor wafer.
Figure 9C:
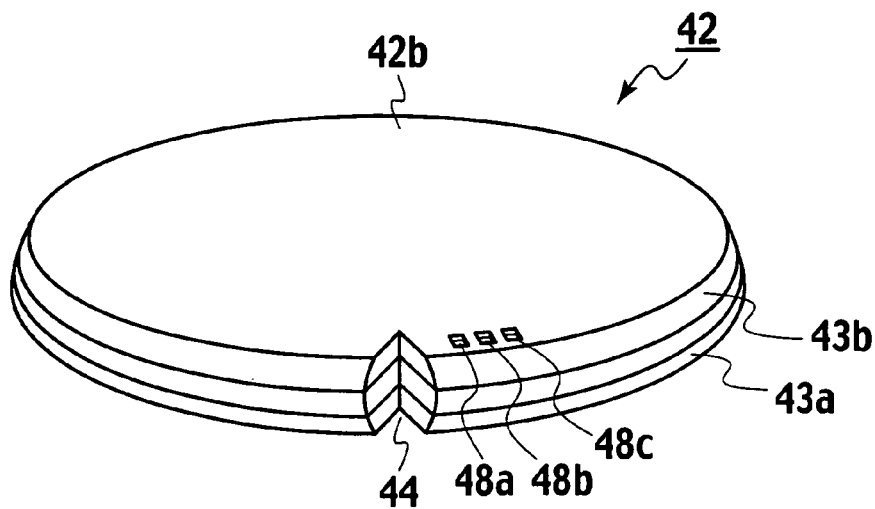
FIG. 9C is a schematic birds-eye view illustrating a further subsequent configuration in which a third ID mark is added at adjacent site of the second ID mark on the bottom surface of the semiconductor wafer.

The making tool $1_i$ appends corresponding first ID marks 47a, or 48a which differ mutually depending on the base materials, on the unprocessed site of each of the base materials, which is scheduled to be processed by the processing unit $12_i$, before a planned sequence of production processes begin. When the first ID mark 47a or 48a is damaged during the manufacturing processes, the mark recognizing unit $13_i$ conjectures original data corresponding to the damaged first ID mark 47a, 48a, and generates the second ID mark 47b or 48b on the basis of the conjectured original data. And as shown in FIGS. 8B and 9B, the marking tool $1_i$ appends the second ID mark 47b, 48b adjacent to the damaged first ID mark 47a, 48a of the base material 42, in which the first ID mark 47a, 48a has been damaged. And further, when the second ID mark 47b or 48b is damaged during the manufacturing processes, the mark recognizing unit $13_i$ conjectures original data corresponding to the damaged second ID mark 47b, 48b, and generates the third ID mark 47c or 48c on the basis of the conjectured original data. And as shown in FIGS. 8C and 9C, the marking tool $1_i$ appends the third ID mark 47c, 48c adjacent to the damaged second ID mark 47b, 48b of the base material 42, in which the second ED mark 47b, 48b has been damaged.

The mark recognizing unit $13_i$ may be equipped in a loading unit for the base materials, the loading unit is equipped in each of the manufacturing machines $16_i$, $16_{i+1}$, $16_{i+2}$, $16_{i+3}$, $16_{i+4}$, . . . . The loading unit sends one lot of the base materials into the corresponding processing unit $12_i$. A plurality of base materials assigned as one lot are distinguished by the mark recognizing unit $13_i$ in the loading unit of the base materials. Thus, the mark recognizing unit $13_i$ embraces a reading unit 3, an error correction unit $4_i$ and a conjecturing unit $5_i$.

Figure 2B:
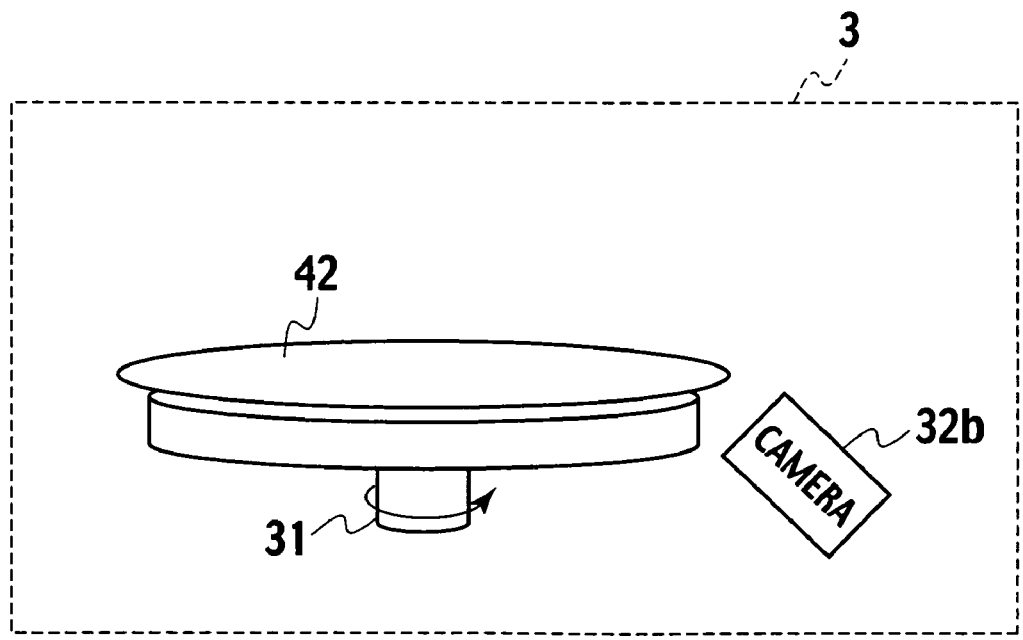
FIG. 2B is a schematic bird's-eye view illustrating another example of a reading unit in the mark recognizing unit implementing the ID mark recognition system of the first embodiment.

As shown in FIG. 2A, the reading unit $3_i$ of the mark recognizing unit $13_i$ includes a photoelectric transducer 32a such as a CCD camera—in FIGS. 2A and 2B, generic expression of "the reading unit 3" is employed for representing the reading units $3_i$, $3_{i+1}$, $3_{i+2}$, $3_{i+3}$, $3_{i+4}$, . . . . Because, in FIG. 2A, a semiconductor substrate (semiconductor wafer) 42 is used for "the base material", the reading unit 3 further includes an object stage (wafer stage) 31 for mounting the object base material (semiconductor wafer) 42 beside the photoelectric transducer 32a. The photoelectric transducer 32a is disposed above the semiconductor wafer 42 and oriented along a direction such that the photoelectric transducer 32a can observe a top surface of, or alternatively a lateral face such as a beveled contour of a semiconductor wafer 42. Although an illustration is omitted, the object stage 31 has a mechanism for chucking the semiconductor substrate (semiconductor wafer) 42. Techniques such as vacuum chucking, electrostatic chucking and an edge clamp technique can be adopted for the chucking mechanism. In addition, the object stage 31 can relatively move the ID mark of the semiconductor substrate (semiconductor wafer) 42 towards the photoelectric transducer 32a by rotating the semiconductor substrate 42 through a rotation mechanism. By the photoelectric transducer 32a of the reading unit 3, an image of the ID mark appended on the semiconductor substrate (the base material) 42 is recognized and processed so that the image of the ID mark is converted into binary bit data (hereinafter referred to as simply "bit data"), and the converted bit data are delivered to the error correction unit $4_i$ from the reading unit 3. In the reading unit $3_i$, each of the semiconductor substrates (semiconductor wafers) 42 assigned as one lot is sequentially chucked and rotated by the wafer stage (object stage) 31 so that each of the ID marks of the semiconductor substrates 42 (semiconductor wafers) is successively read by the reading unit $3_i$.

Similar to the reading unit 3 shown in FIG. 2A, another reading unit 3 of the mark recognizing unit reading units $3_i$, $3_{i+1}$, $3_{i+2}$, $3_{i+3}$, $3_{i+4}$, . . . also includes a wafer stage (object stage) 31 for mounting the semiconductor substrate (semiconductor wafer) 42 and a photoelectric transducer 32b such as a CCD camera, as shown in FIG. 2B. However, the photoelectric transducer 32b is disposed under the semiconductor wafer 42 and oriented along a direction such that the photoelectric transducer 32b can observe a bottom surface of, or alternatively a lower-lateral face of a semiconductor wafer 42. Other structure and function are similar to the structure and function already explained in FIG. 2A, overlapping or redundant description may be omitted in FIG. 2B.

The error correction unit $4_i$ of the mark recognizing unit $13_i$ can correct error bits in the converted bit data of the ID mark by such methodologies as convolution architecture and Reed-Solomon architecture. It is generally said that the convolution architecture is suitable for processing small quantities of data and the Reed-Solomon architecture is suited for a process with a large quantities of data, however, hereinafter, explanations will be made with regard to the error correction ability using the Reed-Solomon architecture except for a case in which a specific architecture is designated, since the Reed-Solomon architecture rarely makes a mistake when recognizing a damaged ID mark as long as the deteriorated levels lie within a range that the error correction ability of the Read-Solomon architecture can cover. Namely for a case in which about 20% to 30% of the ID mark is deteriorated, the images of the ID mark can be converted to bit data. However, the convolution architecture can hardly read the ID mark in the case where the deterioration is generated on the ID mark itself. Thus, in the case where the deteriorated bit data converted by the reading unit $3_i$ lies within the range that the error correction ability of the Read-Solomon architecture can cover, the error correction unit $4_i$ corrects the deteriorated bit data into "normal bit data" and delivers "the normal bit data," to the management server (host computer) 14 in addition to the other normal bit data, to which the error correction to the converted bit data was not originally required. The sampling unit 10 in the management server (host computer) 14 identifies each of the normal bit data, transmitted from the manufacturing machines $16_i$, $16_{i+1}$, $16_{i+2}$, $16_{i+3}$, $16_{i+4}$, . . . , with corresponding original data for one lot of the base materials, the original data are stored in the management data base (data memory) 15. On the contrary, in the case where the deteriorated data which were read by the reading unit 3 do not lie within the range that the error correction ability of the Read-Solomon architecture can cover, the error correction unit $4_i$ delivers the deteriorated data to the conjecturing unit $5_i$ as "damaged data".

The conjecturing unit $5_i$ of the mark recognizing unit $13_i$ is implemented by a damaged data register $6_i$, an original data register $7_i$, a comparator $8_i$ and a judgement unit $9_i$. The damaged data register $6_i$ stores "the damaged data" delivered from the error correction unit $4_i$. The original data register $7_i$ stores candidate data which were sampled by the sampling unit 10 in the management server (host computer) 14. In other words, in original data stored in the management server (host computer) 14, part of the original data which can not be identified with the converted bit data of the ID mark, are stored in the original data register $7_i$ as "candidate original data".

The comparator $8_i$ in the conjecturing unit $5_i$ compares the candidate original data stored in the original data register $7_i$, with the damaged data stored in the damaged data register $6_i$ bit by bit, calculates a respective concordance ratio of the candidate original data with the damaged data. The comparator $8_i$ conjectures each of the candidate original data as "a conjectured bit data" for each of the damaged data under a paramount-criterion. The paramount-criterion is so set that the comparator $8_i$ can conjecture one of candidate original data having the highest concordance ratio against to a subject damaged data as the conjectured bit data of the subject damaged data. Then, the candidate original data that has the largest concordance ratio is conjectured as the conjectured bit data of the subject damaged data.

As shown in FIG. 1B, the mark recognizing unit $13_{i+1}$ has a similar organization as the mark recognizing unit $13_i$ and embraces a reading unit $3_{i+1}$, an error correction unit $4_{i+1}$ and a conjecturing unit $5_{i+1}$, which have similar functions as the reading unit $3_i$, the error correction unit $4_i$ and the conjecturing unit $5_i$, respectively. The conjecturing unit $5_{i+1}$ of the mark recognizing unit $13_{i+1}$ has a similar organization as the conjecturing unit $5_i$ and encompasses a damaged data register $6_{i+1}$, an original data register $7_{i+1}$, a comparator $8_{i+1}$ and a judgement unit $9_{i+1}$, which have similar functions as the damaged data register $6_i$, the original data register $7_i$, the comparator $8_i$ and the judgement unit $9_i$, respectively, and overlapping or redundant description may be omitted in FIG. 1B.

Although illustrations are omitted, the mark recognizing unit $13_{i+2}$, $13_{i+3}$, $13_{i+4}$, . . . in the other manufacturing machines $16_{i+2}$, $16_{i+3}$, $16_{i+4}$, . . . have similar organizations as the mark recognizing unit $13_i$ and embraces reading units $3_{i+2}$, $3_{i+3}$, $3_{i+4}$, error correction units $4_{i+2}$, $4_{i+3}$, $4_{i+4}$, and conjecturing units $5_{i+2}$, $5_{i+3}$, $5_{i+4}$, which have similar functions as the reading unit $3_i$, the error correction unit $4_i$ and the conjecturing unit $5_i$, respectively, and redundant description may be omitted.

For instance, suppose that in twenty-five ID marks appended respectively on twenty-five base materials implementing one lot, twenty-two ID marks on the base materials are recognized and three damaged data of the ID marks are generated: each of the three original data for the three base materials providing the damaged data of the ID marks, from which the recognized information by the mark recognizing unit $13_i$ can not be registered, is assigned as "a first candidate original data", "a second candidate original data" and "a third candidate original data"; on the while, each of the three damaged data registered in the damaged data register $6_i$ is assigned as "a damaged data A", "a damaged data B" and "a damaged data C". The comparator $8_i$ conjectures the corresponding original data by calculating each of the concordance ratios through comparing the first candidate original data, the second candidate original data and the third candidate original data with the damaged data A, the damaged data B and the damaged data C, respectively.

More specifically, the comparator $8_i$ compares the damaged data A with each of the first candidate original data, the second candidate original data and the third candidate original data, firstly, and compares the damaged data B with each of the first candidate original data, the second candidate original data and the third candidate original data, secondly, and thirdly, compares the damaged data C with each of the above-three candidate data so as to calculate each of the concordance ratios.

Since both the damaged data and the candidate original data are binary data, these two kinds of data can be compared using a well-known method. For instance, in the case where damaged data "101010101" are compared with candidate data "101010100", since only the lowest digit differs, the concordance ratio is 89%.

In this manner, the comparator $8_i$ in the conjecturing unit $5_i$ can calculate the concordance ratio by comparing the damaged data with the candidate original data. Note that alternatively, the concordance ratio can be calculated by the comparator $8_i$ by calculating at least the number of digits which coincide, or alternatively the number of digits which do not coincide, or the discordance ratio can be calculated by comparing the damaged data with the candidate original data and counting the number of digits which do not coincide, however, explanations will be made hereinafter, supposing that the concordance ratio of the damaged data with the candidate original data is to be calculated.

FIG. 5 shows each of the concordance ratios through comparing the first candidate original data, the second candidate original data and the third candidate original data with the damaged data A, the damaged data B and the damaged data C, respectively.

As shown in FIG. 5, supposing that the concordance ratio of the damaged data A with the first candidate original data is 70% and the concordance ratio of the damaged data A with the second candidate original data is 65% and the concordance ratio of the damaged data A with the third candidate original data is 63%, and similarly supposing that each of the concordance ratios of the damaged data B with the first, second and third candidate original data is 68%, 67% and 69% respectively, and each of the concordance ratios of the damaged data C with the first, second and third candidate original data is 69%, 70% and 63% respectively.

Under the above-mentioned assumption, after calculating each of the concordance ratios, the comparator $8_i$ in the conjecturing unit $5_i$ conjectures a candidate original data, which has the highest concordance ratio to a subject damaged data, as the candidate original data for the subject damaged data. For instance, as the damaged data A has the highest concordance ratio when compared with the first candidate original data, the comparator $8_i$ conjectures and recognizes that the ID mark of the damaged data A is the two-dimensional code which was converted from the first candidate original data two-dimensionally. Similarly, the comparator $8_i$ conjectures and recognizes that the ID mark of the damaged data B is converted from the third candidate original data and that the ID mark of the damaged data C is converted from the second candidate original data.

The judgement unit $9_i$ in the conjecturing unit $5_i$ judges whether the candidate original data corresponding to the damaged data, which are conjectured and recognized by the comparator $8_i$, can be adopted or not, by subsidiary-criterion which was defined beforehand. The candidate original data which satisfied the subsidiary-criterion is delivered to the outside of the conjecturing unit $5_i$, which enables the processing unit $12_i$ and the marking tool $1_t$ to operate. The subsidiary criterion used by the judgement unit $9_i$ includes for instance the following three criterions.

First Subsidiary-Criterion:

"The first subsidiary-criterion" is that a concordance ratio of the candidate original data with the damaged data must be over 63%. In the case where a two-dimensional code implemented by 196 bits of sixteen by sixteen is used for an ID mark, dots of the ID mark must be appended within a range from 76-th bit to 123-rd bit so as to establish error correction ability in the two-dimensional code. When the photoelectric transducer 32 recognizes images of an ID mark, there are cases where a finder pattern 100 and a tiling pattern 200 are misread, and an ID mark is damaged over the whole area. In such cases, the mark recognizing unit $13_i$ recognizes whole bit of the ID mark as "0", or alternatively "1". When the whole bit of the ID mark becomes "0", or alternatively "1", concordance ratios of the candidate original data with the damaged data range from 37% to 63%. Therefore, when a concordance ratio of a candidate original data with a damaged data indicates below 63%, it is preferable that the ID mark should be identified and processed as "unrecognizable ID mark", since there is a possibility that the ID mark is damaged over the whole area. Thus, that a concordance ratio of the candidate original data with the damaged data is over 63% becomes the first subsidiary-criterion.

Second Subsidiary-Criterion:

"The second subsidiary-criterion" is that a difference between the highest concordance ratio and the second highest concordance ratio must be equal to or larger than 8%.

FIG. 6 shows concordance ratios between damaged data and candidate original data. This is an experimental result showing concordance ratios between the damaged data of the base material #1 read by the mark recognizing unit $13_i$, and the candidate original data of the base materials #1 to #25 stored in the management data base (data memory) 15 of the management server (host computer) 14, which were obtained by varying damages, beyond the error correction ability of the mark recognizing unit $13_i$, to the ID mark of the base material #1 so that the given damages change in ten different levels, without changing the ID marks on the base materials #2 to #25.

In FIG. 6, column "(a)" shows the concordance ratios between the damaged data of the base material #1 and the candidate original data of the base material #1 and column "(b)" shows the highest values as a concordance ratio in the concordance ratios between the damaged data of the base material #1 and the candidate original data of the base materials #2 to #25. Column "(a)-(b)" means the difference between the concordance ratios in column "(a)" and the concordance ratios in column "(b)". Column "(a)-(b)" shows the difference between the highest concordance ratio and the second highest concordance ratio. A column "judgment" shows whether the ID mark of the base material #1 was recognized and conjectured properly in the subject experiment.

Because the damaged data of the base material #1 is inherently based upon the candidate original data of the base material #1, the concordance ratios in column "(a) must be higher than the concordance ratios in column (b)". However, in the first, second and fifth experiments, the concordance ratios in column "(b)" are higher than the concordance ratios in column "(a)". The first, second and fifth experiments show that a difference between the highest concordance ratio and the second highest concordance ratio is relatively small.

As the first, second and fifth experiments show, when the difference between the highest concordance ratio and the second highest concordance ratio is below 8%, there is a possibility that the ID mark is conjectured improperly. Thus, the second subsidiary-criterion is established so that only in the case where the difference between the highest concordance ratio and the second highest concordance ratio is above 8%, the conjecture and recognition of the ID mark are effective.

Figure 7:
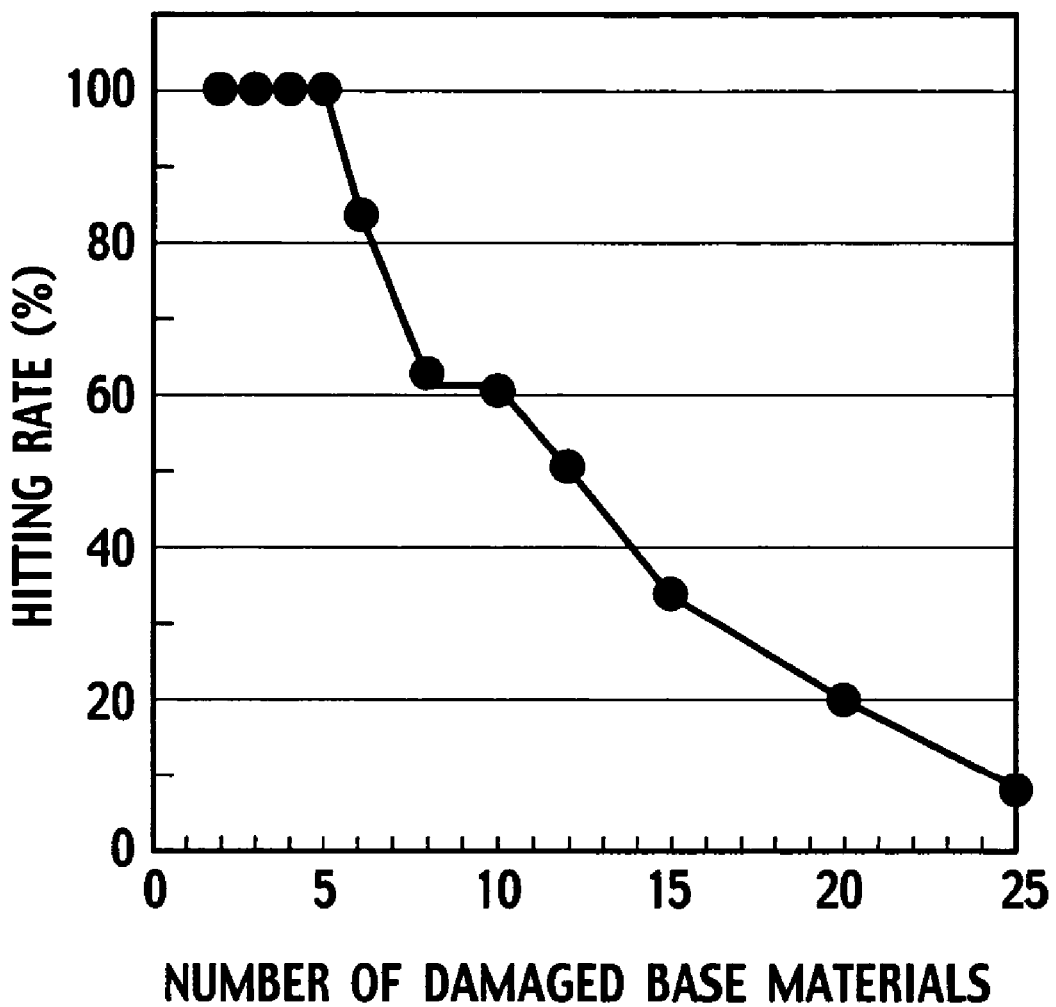
FIG. 7 is a diagram showing relationships between hitting rate of true ID mark and the number of mark-damaged base materials.

Third Subsidiary-Criterion:

"The third subsidiary-criterion" adopts the conjectured bit data as the true bit data, when the number of base materials that have generated the damaged data is equal to or smaller than five. FIG. 7 is an experimental result showing relationships between the hitting rate of a true ID mark and the number of mark-damaged base materials according to the first embodiment. Here, "the hitting rate" is a value showing a percentage with which how many ID marks are properly specified in the ID marks of the mark-damaged base materials, which are conjectured and recognized by the recognition method of the first embodiment.

As shown in FIG. 7, when the number of mark-damaged base materials is up to five, most of the base materials are specified without mistakes. Thus, the condition that the number of mark-damaged base materials must be below five becomes the third subsidiary-criterion.

Next, a recognition method of the ID mark of the base material in the above-mentioned ID mark recognition system will be explained with reference to a flowchart shown in FIG. 4, under a condition such that ID marks are already appended on an unprocessed site on each of the base materials, and each of original bit data of the ID marks appended on all of the base materials are already stored in a management data base of a host computer:

(a) For instance, suppose that twenty-five base materials 42 assigned as one lot are sent to a loading unit in a subject kth manufacturing machine. First, the first base material in the twenty-five base materials 42 assigned as one lot is sent to the mark recognizing unit $13_i$ which is equipped in the loading unit of the kth manufacturing machine. When the base material is a semiconductor wafer, as shown in FIG. 2A, the object base material (semiconductor wafer) 42 is mounted on the object stage (wafer stage) 31 of the mark recognizing unit $13_i$. Chucking methodologies such as vacuum chucking, electrostatic chucking and an edge clamp technique can be adopted for fixing the semiconductor wafer on to the wafer stage 31. For instance, in the edge clamp technique, three points at the edge of the base material (semiconductor wafer) 42 may be clamped. The wafer stage 31 rotates relatively the ID mark of the base material (semiconductor wafer) 42 towards the photoelectric transducer 32 by a rotation mechanism so that the photoelectric transducer 32 can read the ID mark of the base material 42.

(b) When the photoelectric transducer 32 recognizes the position of the ID mark of the base material 42, the photoelectric transducer 32 detects the L-shaped finder pattern 100 which is provided to distinguish which direction the data matrix is, and as shown in FIG. 3A, cuts the ID mark in a mesh geometry implemented by fourteen by fourteen cells and forms a coordinate within a rectangular area formed by the finder pattern 100 and a timing pattern (timing cells) 200 facing diagonal to the finder pattern. After cutting into the mesh geometry and forming the coordinate on the ID mark, at step S301, the matrix data on the ID mark, except for the peripheral part of the finder pattern 100 and the timing pattern (timing cells) 200, are sequentially read from the upper left side within the frame of the ID mark, and the matrix data are converted to bit data and are recognized by the mark recognizing unit $13_i$.

(c) Whether the mark recognizing unit $13_i$ can recognize the ID mark or not, depends on whether the damage to the ID mark is beyond the error correction ability of the error correction unit $4_i$ or not. At step S301, when there is no damage on the ID mark or the damage on the ID mark is so small that it is within a limit of the error correction ability in the error correction unit $4_i$, and such that the mark recognizing unit $13_i$ can recognize bit data of the ID mark, proceed to step S302. In the step S302, a sampling unit in a management server (host computer) 14 identifies the recognized bit data of the ID mark with the original bit data (original data) which are stored in a management data base (data memory) 15 of the management server (host computer) 14. Further, when the mark recognizing unit $13_i$ can recognize the bit data of the ID mark, the recognized bit data is delivered to the corresponding kth manufacturing machine.

(d) When the damage to the ID mark at step S301, is beyond the limit of the error correction ability in the error correction unit $4_i$, since the mark recognizing unit $13_i$ can not recognize the deteriorated bit data of the ID mark, the deteriorated bit data are specified as "damaged bit data (damaged data)" and the base material 42 is specified as "mark-damaged base material", and the flow of the recognition method proceeds to step S303. At the step S303, the damaged bit data (damaged data) of the ID mark of the mark-damaged base material are stored in the damaged data register $6_i$.

(e) At step S304, the flow of the recognition method judges whether all the ID marks of the base materials 42 assigned as one lot are read or not. If any of the base materials 42 remains unread, the remaining base material 42 is chucked on the wafer stage 31 in the mark recognizing unit $13_i$ and the corresponding unread ID mark of the remaining base materials 42 is read and converted into bit data so that the unread ID mark can be recognized according to the step S301. A loop in which the procedure returns to step S301 from step S304, and from step S301 proceeds to step S301, and further proceeds through step S302 or alternatively step S303 to step S304, is repeated successively until all of the ID marks of the twenty-five base materials 42 assigned as one lot are recognized sequentially by the mark recognizing unit $13_i$ (at step S304).

(f) Continuously, at step S305, it is confirmed whether there is any mark-damaged base material or not. At step S305, when there is no mark-damaged base material, the recognition of the ID marks is finished. The loading unit sends one lot of the base materials into the corresponding processing unit $12_i$, so that required processing by the subject kth manufacturing machine can be conducted. On the while, at step S305, when there is any mark-damaged base material, proceed to step S306 so as to conjecture and recognize the unread ID mark.

(g) Herein, for instance, suppose that in m=twenty-five ID marks respectively appended on twenty-five base materials implementing one lot, n=twenty-two ID marks on the base materials 42 are recognized and (m−n)=three mark-damaged base materials are generated. At step S306, the sampling unit 10 samples corresponding number (m−n) of candidate original data. Namely, the sampling unit 10 samples the first candidate original data, the second candidate original data and the third candidate original data in this case, which correspond to the above-mentioned three mark-damaged base materials, because the original bit data (original data) of the ID marks of the twenty-two base materials 42, information on which is recognized by the mark recognizing unit $13_i$, are identified with corresponding original data at step S302. That is, among all of the original data of the ID marks of the twenty-five base materials 42 stored in the management data base (data memory) 15 of the management server (host computer) 14, twenty-two original data are excluded in the sampling. The sampling unit 10 stores the first candidate original data, the second candidate original data and the third candidate original data for three base materials respectively into the original data register $7_i$ in the conjecturing unit $5_i$.

(h) Next, at step S307, the comparator $8_i$ in the conjecturing unit $5_i$ compares bit by bit the first candidate original data, the second candidate original data and the third candidate original data corresponding to the three mark-damaged base materials which are stored in the original data register $7_i$, with the corresponding three data of the damaged data A, the damaged data B and the damaged data C, which are stored in the damaged data register in the conjecturing unit $5_i$. The comparator $8_i$ calculates each of the concordance ratios so as to conjecture the original data. After calculating each of the concordance ratios, the comparator $8_i$ conjectures one of candidate original data as a conjectured bit data for each of damaged data under a paramount-criterion, which conjecture a candidate original data having the highest concordance ratio against to a subject damaged data as the conjectured bit data of the subject damaged data. For instance, using the example shown in FIG. 5, since the damaged data A has the highest concordance ratio when compared with first candidate original data, the comparator $8_i$ conjectures and recognizes that the ID mark of the damaged data A is the two-dimensional code converted from the first candidate original data two-dimensionally. Similarly, the comparator $8_i$ conjectures and recognizes that the ID mark of the damaged data B is converted from the third candidate oral data and that the ID mark of the damaged data C is converted from the second candidate original data.

(i) Continuously, at step S308, the judgment unit $9_i$ in the conjecture unit $5_i$ judges whether the conjectured bit data can be adopted as a true bit data for each of the damaged data under a predetermined subsidiary-criterion, which is different from the paramount-criterion. Any of the above-mentioned three subsidiary-criterions can be adopted for the predetermined subsidiary-criterion. The conjectured bit data which satisfied the predetermined subsidiary-criterion is delivered to the outside of the mark recognizing unit $13_i$, as the true bit data of the ID mark to be appended to the subject mark-damaged base materials. On the contrary, the conjectured bit data, which does not satisfy the subsidiary-criterion, is processed as "an illegible ID mark".

(j) Afterwards, the conjectured bit data which satisfied the subsidiary-criterion are converted to a corresponding ID mark of a two-dimensional code, which is engraved on the base material 42 as a new ID mark (the second ID mark) 47*b*, 48*b* by the marking tool $1_i$ as shown in FIGS. 8B and 9B. The base material on which the new ID mark (the second ID mark) 47*b*, 48*b* is engraved, is sent to the processing unit $12_i$ from the loading unit so as to undertake the required processing by the subject kth manufacturing machine.

(k) After the required processing was finished by the kth manufacturing machine, the subject base materials 42 assigned as one lot are sent to the loading unit in the (k+1)th manufacturing machine. Similar to the kth manufacturing machine, the recognition and the conjecture of ID marks are processed according to the procedures of steps S301 to S308 shown in FIG. 4. Namely, at step S305, if there is no mark-damaged base material, the recognition of the ID mark is finished, and the subject base materials 42 assigned as one lot in the loading unit are sent to the processing unit $12_i$ so as to undertake the required processing by the subject (k+1)th manufacturing machine. On the while, at step S305, if there is any mark-damaged base material 42, proceed to steps S306 to S308 so that the recognition and the conjecture of the ID marks can be processed. At step S308, the conjectured bit data which satisfied the subsidiary-criterion are converted to the corresponding ID mark of two-dimensional code, which is engraved on the base material 42 as a newest ID mark (the third ID mark) $47c$, $48c$ by the marking tool $1_i$ as shown in FIGS. 8C and 9C. The base material on which the newest ID mark (the third ID mark) $47c$, $48c$ is engraved is sent to the processing unit $12_i$ from the loading unit so as to undertake the required processing by the subject (k+1)th manufacturing machine.

(l) In the same manner, the (k+2)th manufacturing machine executes next process, while ID marks are engraved when required, even in the case where the deterioration on the ID marks exceeds the limit of the error correction ability. With the proceeding of the planned sequence of production processes, the time taken in the recognition of the ID marks becomes shorter.

As mentioned-above, according to the first embodiment of the present invention, the ID mark of the base material 42, in which deteriorations are generated exceeding the limit of the error correction ability in the mark recognizing unit, can be recognized, which can improve the manufacturing yield in a planned sequence of production processes of products (industrial products).

SECOND EMBODIMENT

Specific Embodiment

Next, a specific embodiment of the present invention will be explained as a second embodiment with reference to a case where a semiconductor device (semiconductor integrated circuit) is manufactured. As shown in FIG. 10, an ID mark recognition system according to the second embodiment of the present invention, includes a management server (host computer) 14 and a processing unit of a poly-Si CVD $12_p$, a processing unit of a first thickness monitor $12_{p+1}$, a processing unit of an amorphous-Si (a-Si) CVD $12_{p+2}$, a processing unit of a second thickness monitor $12_{p+3}$, a processing unit of an anti-reflection coating (ARC) $12_{p+4}$, a processing unit of a spinner $12_{p+5}$, a processing unit of a baking oven $12_{p+6}$, a processing unit of a projection printer $12_{p+7}$, a processing unit of a developer $12_{p+8}$, a processing unit of a resist pattern monitor $12_{p+9}$, a processing unit of an ARC etcher $12_{p+10}$, a processing unit of an amorphous-Si etcher a processing unit of $12_{p+11}$, a processing unit of a poly-Si etcher $12_{p+12}$, a processing unit of geometry monitor $12_{p+13}$, and a processing unit of an etch depth monitor $12_{p+14}$. Also the ID mark recognition system according to the second embodiment of the present invention, includes a plurality of mark recognition units (mark recognizer) $13_p$, $13_{p+1}$, $13_{p+2}$, $13_{p+3}$, ..., $13_{p+14}$, connected to the processing units $12_p$, $12_{p+1}$, $12_{p+2}$, $12_{p+3}$, ... $12_{p+14}$ respectively, configured to obtain recognized data of ID mark appended to semiconductor wafers (base materials) to be processed in the processing units $12_p$, $12_{p+1}$, $12_{p+2}$, $12_{p+3}$, ... $12_{p+14}$ according to a specific data-collection plan sequentially and to transmit the recognized data of ID mark in predetermined timings to the management server 14 respectively.

The management server (host computer) 14 embraces a management data base (data memory) 15 and a sampling unit 10. The management server (host computer) 14 controls a planned sequence of production processes of the semiconductor device (semiconductor integrated circuit), which is executed by the processing units $12_p$, $12_{p+1}$, $12_{p+2}$, $12_{p+3}$, ... $12_{p+14}$. The management data base (data memory) 15 stores original bit data of ID marks (hereinafter referred to simply as "original data") appended to each of the semiconductor wafers assigned as one lot, the semiconductor wafers are processed sequentially by the processing units $12_p$, $12_{p+1}$, $12_{p+2}$, $12_{p+3}$, ... $12_{p+14}$. The original data for one lot are stored in the management data base (data memory) 15 before the planned sequence of production processes begin, by the marking tool $1_i$, which appends corresponding ID marks on the semiconductor wafers, respectively. When the ID marks are already appended to the semiconductor wafers by wafer producer or wafer supplier, the ID marks for one lot are read by a mark recognizing unit and stored in the management data base 15 before the planned sequence of production processes begin.

The sampling unit 10 in the management server (host computer) 14 identifies each of the recognized information on the ID marks, transmitted from the mark recognition units (mark recognizer) $13_p$, $13_{p+1}$, $13_{p+2}$, $13_{p+3}$, ..., $13_{p+14}$, with corresponding original data for one lot of the semiconductor wafers, which are stored in the management data base (data memory) 15. The sampling unit 10 samples the remnant original data, which can not be identified with the information on the ID mark transmitted from the mark recognition units (mark recognizer) $13_p$, $13_{p+1}$, $13_{p+2}$, $13_{p+3}$, ..., $13_{p+14}$, as "candidate original data". Note that the mark recognition units (mark recognizer) $13_p$, $13_{p+1}$, $13_{p+2}$, $13_{p+3}$, ..., $13_{p+14}$, are connected to the management server (host computer) 14 through LAN of the MES and that the management server (host computer) 14 is not limited to a single computer as explained in the first embodiment, and a plurality of management servers may physically exist for controlling a large number of processing units.

Figure 11:
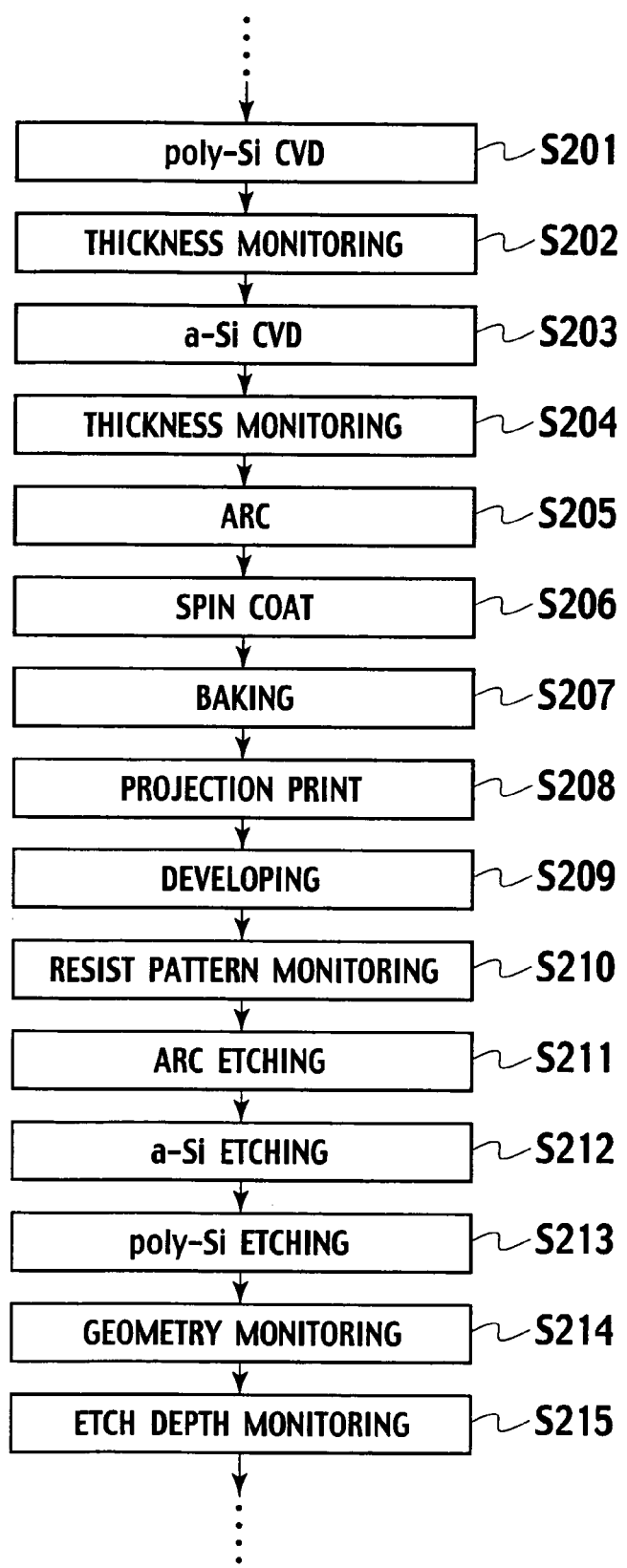
FIG. 11 is a flowchart illustrating part of the sequence of process flows implementing a recognition method of the ID mark of the semiconductor wafer according to the second embodiment of the present invention.

FIG. 10 shows part of the ID mark recognition system according to the second embodiment of the present invention, implemented by a large number of units and/or equipment, which are adopted for the vast and complicated manufacturing processes of the semiconductor device. In other words, the ID mark recognition system shown in FIG. 10 corresponds to part of a sequence of the manufacturing processes of the second embodiment, as shown in FIG. 11, which discloses only a poly-Si CVD process at step S201, a first thickness monitoring process at step S2021, an amorphous-Si CVD process at step S203, a second thickness monitoring process at step S204, an ARC process at step S205, a spin coat process at step S206, a baking process at step S207, a projection print process at step S208, a developing process at step S209, a resist pattern monitoring process at step S210, an ARC reactive ion etching (RIE) process at step S211, an amorphous-Si RIE process at step S212, a poly-Si RIE process at step S213, a geometry monitoring process at step S214 and an etch depth monitoring process at step S215. Note that miscellaneous units and equipment configured to execute a sequence of production processes before the process of step S201 and other miscellaneous units and equipment configured to execute a sequence of production processes after the process of step S215, of course exist in the whole manufacturing process.

Hereinafter, a manufacturing method of the semiconductor device according to the second embodiment of the present invention will be explained with reference to the process flow diagram of FIG. 11 as well as the flowchart shown in FIG. 4, under a condition such that ID marks are already appended on an unprocessed site on each of the semiconductor wafers, and each of original bit data of the ID marks appended on all of the semiconductor wafers are already stored in a management data base of a host computer:

(a) At step S201, suppose that twenty-five semiconductor wafers 42 assigned as one lot, are sent to one of the loading units (wafer loaders) which is connected to a subject processing unit, or the processing unit of poly-Si CVD (poly-Si CVD furnace) $12_p$. First, from the management server (host computer) 14, individual specific instructions (job instructions) for establishing a one lot process of poly-Si CVD by processing twenty-five semiconductor wafers 42 are transmitted to the poly-Si CVD furnace $12_p$. According to the job instructions, a first semiconductor wafer 42 in twenty-five pieces assigned as one lot, is sent to the mark recognizer 13 in the wafer loader, which is connected to the poly-Si CVD furnace $12_p$. Then, as shown in FIG. 2A, the first semiconductor wafer (base material) 42 is mounted and chucked by the wafer stage 31 in the mark recognizer 13. Such techniques as vacuum chucking, electrostatic chucking and an edge clamp technique can be adopted for the chucking mechanism. In addition, the wafer stage 31 can relatively move the ID mark of the semiconductor wafer 42 towards the photoelectric transducer 32 by rotating the semiconductor wafer 42 through a rotation mechanism, which enables the photoelectric transducer 32 to recognize the position of the ID mark on the first semiconductor wafer 42.

(b) When the photoelectric transducer 32 recognizes the position of the ID mark of the first semiconductor wafer 42, the photoelectric transducer 32 detects the L-shaped finder pattern 100 which is provided to distinguish which direction the data matrix of the ID mark is. The photoelectric transducer 32 cuts the ID mark in a mesh geometry so as to form a coordinate within a rectangular area implemented by the finder pattern 100 and a timing pattern (timing cells) 200 facing diagonal to the finder pattern. Namely, at step S301 in FIG. 4, the matrix data on the ID mark, except for the peripheral part of the finder pattern 100 and the timing pattern (timing cells) 200, are sequentially read from the upper left side within the frame of the ID mark, and the matrix data are converted to bit data and are recognized by the mark recognizer 13. At step S301, when the mark recognizer 13 can recognize the ID mark, it proceeds to step S302 so as to identify the recognized information with the original data, which are stored in the management data base (data memory) 15 of the management server (host computer) 14. When the damage to the ID mark at step S301, is beyond the limit of the error correction ability in the error correction unit 41, since the mark recognizer 13 can not recognize the ID mark, the first semiconductor wafer 42 is judged as "mark-damaged semiconductor wafer" so as to proceed to step S303. At step S303, bit data (damaged data) of the ID mark of "the mark-damaged semiconductor wafer" are stored in the damaged data register $6_i$.

(c) At step S304, the flow of the recognition method judges whether reading of all the ID marks of the semiconductor wafers 42 assigned as one lot is finished or not. If a semiconductor wafer 42 is left unread, the unread semiconductor wafer 42 is chucked on the wafer stage 31 in the mark recognizer 13 and the ID mark of the unread semiconductor wafers 42 is recognized again according to step S301. A loop in which the procedure returns to step S301 from step S304, and from step S301 proceeds to step S301, and further proceeds through step S302 or alternatively step S303 to step S304, is repeated until all of the ID marks of the twenty-five semiconductor wafers 42 of one lot are recognized by the mark recognizing unit $13_i$ (at step S304). Continuously, at step S305, it is confirmed whether there are any mark-damaged semiconductor wafers or not. At step S305, when there are no mark-damaged semiconductor wafers, the recognition of the ID marks is finished. The wafer loader sends all of the semiconductor wafers implementing one lot into the poly-Si CVD furnace $12_p$. And the poly-Si CVD process at step S201 shown in FIG. 11 is processed. On the while, at step S305, when there is any mark-damaged semiconductor wafer, proceed to step S306 so as to conjecture and recognize the unread ID mark on the remnant mark-damaged semiconductor wafer.

(d) By the procedures of steps S306 to S308 explained in the first embodiment, the unread ID mark is conjectured and recognized by the comparator $8_i$ in the conjecturing unit $5_i$ from the candidate original data which were sampled by the sampling unit 10. The judgment unit $9_i$ in the conjecturing unit $5_i$ judges whether the conjectured bit data corresponding to the damaged data is true or not by predetermined subsidiary-criterion. The conjectured bit data which satisfied the predetermined subsidiary-criterion are converted to a corresponding ID mark of a two-dimensional code, which is engraved on the semiconductor wafer 42 as a new ID mark (the second ID mark) 47b, 48b as shown in FIGS. 8B and 9B. The semiconductor wafer 42 on which the new ID mark (the second ID mark) 47b, 48b is engraved, is sent to the poly-Si CVD furnace $12_p$ from the wafer loader so as to undertake the poly-Si CVD process. Note that in the case of CVD process, since there is a case in which the semiconductor wafer 42 is contaminated because of engraving the new ID mark (the second ID mark) 47b, 48b, pre-treatment such as cleaning of the semiconductor wafer 42 by a chemical solution may be added after the new ID mark (the second ID mark) 47b, 48b is engraved on the semiconductor wafer 42.

(e) After the CVD by the poly-Si CVD furnace $12_p$ is finished, the subject semiconductor wafers 42 assigned as one lot are sent to the wafer loader in a processing unit of a first thickness monitor $12_{p+1}$, to undertake thickness monitoring at step S202. In the wafer loader connected to the processing unit of the first thickness monitor $12_{p+1}$, similar to the wafer loader connected to the poly-Si CVD furnace $12_p$, the same recognition and conjecture of the ID mark are processed by the procedures of steps S301 to S308 shown in FIG. 4. Namely, at step S305, if there is no mark-damaged semiconductor wafer generated by the poly-Si CVD process, the recognition of the ID mark is finished, and one lot of the subject semiconductor wafers 42 in the wafer loader are sent to the processing unit of the first thickness monitor $12_{p+1}$, so as to undertake the thickness monitoring process. On the while, at step S305, if there is any mark-damaged semiconductor wafer 42, proceed to steps S306 to S308 so that the recognition and the conjecture of the ID marks can be processed. At step S308, the conjectured bit data which satisfied the subsidiary-criterion are converted to the corresponding ID mark of a two-dimensional code, which is engraved on the semiconductor wafer 42 as a new ID mark (the second ID mark) 47b, 48b as shown in FIGS. 8B and 9B. If the identified mark-damaged semiconductor wafer becomes a new mark-damaged semiconductor wafer again by the poly-Si CVD process, an ID mark of a two-dimensional code is engraved on the semiconductor wafer 42 adjacent to the new ID mark (the second ID mark) 47b, 48b as a further new ID mark (the third ID mark) 47c, 48c as shown in FIGS. 8C and 9C. One lot of the subject semiconductor wafers 42, on which the new ID mark (the second ID mark) 47b, 48b or alternatively the further new ID mark (the third ID mark) 47c, 48c are engraved additionally, in the wafer loader are sent to the processing unit of the first thickness monitor $12_{p+1}$, so as to undertake the thickness monitoring process at step S202.

(f) After the thickness monitoring by the processing unit of the first thickness monitor $12_{p+1}$ is finished, one lot of the subject semiconductor wafers 42 are sent to the wafer loader connected to a processing unit of amorphous-Si CVD (amorphous-Si CVD furnace) $12_{p+2}$, to undertake amorphous-Si CVD process at step S203. Similarly, in the wafer loader connected to the amorphous-Si CVD furnace $12_{p+2}$, the same recognition and conjecture of the ID mark are processed by the procedures at steps S301 to S308 shown in FIG. 4. Namely, at step S305, if there are no mark-damaged semiconductor wafer by the thickness monitoring process at step S202, the recognition of the ID mark is finished, and one lot of the subject semiconductor wafers 42 in the wafer loader are sent to the amorphous-Si CVD furnace $12_{p+2}$, so as to undertake the amorphous-Si CVD process. On the while, at step S305, if there is any mark-damaged semiconductor wafer 42, it proceeds to steps S306 to S308 so that the recognition and the conjecture of the ID marks can be processed. At step S308, the conjectured bit data which satisfied the subsidiary-criterion are converted to the corresponding ID mark of a two-dimensional code, which is engraved on the semiconductor wafer 42 as a new ID mark (the second ID mark) 47b, 48b as shown in FIGS. 8B and 9B. If the identical mark-damaged semiconductor wafer becomes a mark-damaged semiconductor wafer again in the repeated procedures, an ID mark of a two-dimensional code is engraved on the semiconductor wafer 42 adjacent to the new ID mark (the second ID mark) 47b, 48b as a further new ID mark (the third ID mark) 47c, 48c as shown in FIGS. 8C and 9C. If the third ID mark 47c, 48c is deteriorated, a still further new ID mark (the fourth ID mark) is engraved. One lot of the subject semiconductor wafers 42, on which the new ID mark (the second ID mark) 47b, 48b, the further new ID mark (the third ID mark) 47c, 48c or the still further new ID mark (the fourth ID mark) are engraved additionally in the wafer loader are sent to the amorphous-Si CVD furnace $12_{p+2}$, so as to undertake the amorphous-Si CVD process at step S203. Note that a possibility of contamination and deterioration of the ID mark by the thickness monitoring process at step S202 is very small.

(g) After the CVD process by the amorphous-Si CVD furnace $12_{p+2}$, one lot of the subject semiconductor wafers 42 are sent to the wafer loader connected to the processing unit of second thickness monitor $12_{p+3}$ to undertake the thickness monitoring process at step S204. Similarly, in the processing unit of a second thickness monitor $12_{p+3}$, the same recognition and conjecture of the ID mark are processed by the procedures at steps S301 to S308 shown in FIG. 4. Namely, at step S305, if there are no mark-damaged semiconductor wafer by the amorphous-Si CVD process, the recognition of the ID mark is finished, and one lot of the subject semiconductor wafers 42 in the wafer loader are sent to the processing unit of a second thickness monitor $12_{p+3}$, so as to undertake the thickness monitoring process at step S204. On the while, at step S305, if there is any mark-damaged semiconductor wafer 42, it proceeds to steps S306 to S308 so that the recognition and the conjecture of the ID marks can be processed. At step S308, the conjectured bit data which satisfied the subsidiary-criterion are converted to the corresponding ID mark of a two-dimensional code, which is engraved on the semiconductor wafer 42 as a new ID mark (the second ID mark) 47b, 48b as shown in FIGS. 8B and 9B. If the identical mark-damaged semiconductor wafer becomes a mark-damaged semiconductor wafer again in the repeated procedures, an ID mark of a two-dimensional code is engraved on the semiconductor wafer 42 adjacent to the new ID mark (the second ID mark) 47b, 48b as a further new ID mark (the third ID mark) 47c, 48c as shown in FIGS. 8C and 9C. Still if the third ID mark 47c, 48c is deteriorated, a still further new ID mark (the fourth ID mark) is engraved. Still further, if the fourth ID mark is deteriorated, a yet still further new ID mark (the fifth ID mark) is engraved. The subject semiconductor wafers 42 of one lot, on which the second ID mark 47b, the third ID mark 47c, 48c, the fourth ID mark or the fifth ID mark are engraved additionally, in the wafer loader are sent to the processing unit of a second thickness monitor $12_{i+3}$, so as to undertake the thickness monitoring process at step S204.

(h) In the same manner, processes to be undertaken at and after step S205 are executed while ID marks are engraved when required, even in the case where the deterioration on the ID marks exceeds the limit of the error correction ability. With the proceeding of the planned sequence of production processes, the time required for the recognition of the ID marks becomes shorter.

As mentioned-above, according to the second embodiment of the present invention, the ID mark of the semiconductor wafer 42, in which deteriorations are generated exceeding the limit of the error correction ability in the mark recognizing unit, can be recognized, which can improve the manufacturing yield in a planned sequence of production processes of a semiconductor device (semiconductor integrated circuit).

Other structure and materials are similar to the structure and materials already explained in the first embodiment, and overlapping or redundant description may be omitted in the second embodiment.

OTHER EMBODIMENTS

Various modifications will become possible for those skilled in the art after receiving the teaching of the present disclosure without departing from the scope thereof.

In the above-mentioned second embodiment, although the ID mark recognition system for a manufacturing method of a semiconductor device is illustrated, the ID mark recognition system according to the second embodiment can be applicable to various manufacturing methods of electric devices such as liquid crystal devices, magnetic recording media, optical recording media, thin film magnetic heads, and superconductor elements, in which one lot of base materials are processed.

Thus, the present invention of course includes various embodiments and modifications and the like which are not detailed above. Therefore, the scope of the present invention will be defined in the following claims.

What is claimed is:

1. A method of recognizing different ID marks formed of two-dimensional codes appended respectively on a plurality of base materials so as to identify each of the base materials, where a number of base materials is the same as the number of original bit sequence data to be compared with the base materials such that every ID mark appended to the plurality of base materials are assigned to all of the original bit sequence data, implementing one-to-one correspondences, the method comprising:

reading all of the ID marks appended on all of the base materials, and converting all of the ID marks, base material by base material, into corresponding different bit sequence data, respectively;

sorting all of the base materials into normal and damaged groups, the normal group consisting of base materials to which normal ID marks are appended, identifying each of the converted bit sequence data of the normal ID mark with one of the original bit sequence data, as deterioration of the ID mark is within an error correction ability, the damaged group consisting of base materials to which damaged ID marks are appended, specifying the converted bit sequence data of the damaged ID marks as damaged data, as the deterioration of the damaged ID mark is beyond the error correction ability;

when the damaged group include a plurality of base materials, identifying, base material by base material, each of the base materials of the damaged group, by comparing bit by bit each of the damaged data of the damaged ID marks with a plurality of candidate original data, each of the candidate original data being remnant original bit data that are not identified by the converted bit data of the normal group, a number of candidate original data is the same as the number of damaged ID marks;

calculating successively concordance ratios between a subject damaged data and the plurality of candidate original data, mark by mark, for all of the damaged ID marks under a paramount-criterion, which conjectures successively candidate original data having the highest concordance ratio to the subject damaged data as the conjectured bit sequence data of the subject damaged data so as to implement one-to-one correspondences between the plurality of damaged ID marks and the plurality of candidate original data; and judging whether each of the conjectured bit sequence data can be assigned as true bit sequence data of the damaged ID marks under a subsidiary-criterion, which is different from the paramount-criterion.

2. The method of claim 1, further comprising:
storing each of the original bit sequence data of the ID marks for all of the base materials assigned as one lot in a management data base of a host computer.

3. A method of recognizing ID marks, comprising:
storing each of original bit data of ID marks appended on all of a plurality of base materials assigned as one lot in a management data base of a host computer;
reading each of the ID marks appended the base materials, and converting the ID marks into bit data, respectively;
identifying each of the converted bit data with one of the original bit data, when deterioration of the ID mark is within an error correction ability;
specifying the converted bit data of each of the ID marks as damaged data, when the deterioration of the ID mark is beyond the error correction ability;
sampling candidate original data among the original bit data stored in the management data base each of the candidate original data being original bit data that is not identified by the converted bit data;
comparing bit by bit each of the damaged data with the candidate original data, and calculating concordance ratios between the damaged data and the candidate original data;
conjecturing one of candidate original data as a conjectured bit data for each of the damaged data under a paramount-criterion, which conjectures candidate original data having the highest concordance ratio to subject damaged data as the conjectured bit data of the subject damaged data; and judging whether the conjectured bit data can be adopted as true bit data for each of the damaged data under a subsidiary-criterion, which is different from the paramount-criterion.

4. The method of claim 3, further comprising:
storing the candidate original data in an original data register.

5. The method of claim 4, further comprising:
storing the damaged data in a damaged data register.

6. The method of claim 5, before comparing the candidate original data with each of the damaged data further comprising:
reading out each of the candidate original data from the original data register; and
reading out each of the damaged data from the damaged data register.

7. The method of claim 5, wherein each of the ID marks is represented by a two-dimensional code.

8. The method of claim 7, wherein the subsidiary-criterion adopts the conjectured bit data as the true bit data, when the concordance ratio is equal to or larger than 63%.

9. The method of claim 7, wherein the subsidiary-criterion adopts the conjectured bit data as the true bit data, when a difference between the highest concordance ratio and second highest concordance ratio is equal to or larger than 8%.

10. The method of claim 7, wherein the subsidiary-criterion adopts the conjectured bit data as the true bit data, when the number of base materials which have generated the damaged data is equal to or smaller than five.

11. A system for recognizing ID marks appended respectively on a plurality of base materials so as to identify each of the base materials, the system comprising:
a reading unit configured to read all of the ID marks appended on all of the base materials, and to convert all of the ID marks into bit data, respectively;
an error correction unit configured to correct the converted bit data into normal bit data when deterioration of the ID mark is within an error correction ability, and to specify the converted bit data as damaged data, when the deterioration of the ID mark is beyond the error correction ability;
a host computer having a sampling unit configured to sample candidate original data among original bit data of the ID marks, by identifying the converted bit data with one of the original bit data, each of the candidate original data being original bit data that is not identified by the converted bit data, so as to sort all of the base materials into normal and damaged groups, the normal group consisting of base materials to which normal ID marks are appended, identifying each of the converted bit data of the normal ID mark with one of original bit data, as deterioration of the normal ID mark is within an error correction ability, the damaged group consisting of base materials to which damaged ID marks are appended, specifying the converted bit data of each of the damaged ID marks as damaged data, as the deterioration of the damaged ID mark is beyond the error correction ability;
a comparator configured to compare bit by bit candidate original data with each of the damaged data of the damaged ID marks of the damaged group, to calculate, mark by mark, concordance ratios between the candidate original data and the damaged data, and to conjecture an ID mark having one of candidate original data having the highest concordance ratio to subject damaged data as a damaged ID mark having the conjectured bit data of the subject damaged data so as to identify each of the base materials of the damaged group; and a judgement unit configured to judge whether the conjectured bit data can be adopted as true bit data of the damaged group for each of the subject damaged data.

12. The system of claim 11, further comprising a management data base storing each of the original bit data of the ID marks for all of the base materials.

13. The system of claim 11, further comprising an original data register storing the candidate original data.

14. The system of claim 11, further comprising a damaged data register storing the damaged data.

15. The system of claim 11, wherein each of the ID marks is represented by a two-dimensional code.

16. A system for recognizing ID marks, the system comprising:
   a reading unit configured to read each of the ID marks appended on a plurality base materials, and to convert the ID marks into bit data, respectively;
   an error correction unit configured to correct the converted bit data into normal bit data when deterioration of the ID mark is within an error correction ability, and to specify the converted bit data as damaged data, when the deterioration of the ID mark is beyond the error correction ability;
   a host computer having a sampling unit configured to sample candidate original data among original bit data of the ID marks, by identifying the converted bit data with one of the original bit data, each of the candidate original data being original bit data that is not identified by the converted bit data;
   a comparator configured to compare bit by bit candidate original data with each of the damaged data, to calculate concordance ratios between the candidate original data and the damaged data and to conjecture one of candidate original data having the highest concordance ratio to subject damaged data as the conjectured bit data of the subject damaged data; and
   a judgement unit configured to judge whether the conjectured bit data can be adopted as true bit data for each of the subject damaged data,
   wherein the judgement unit adopts the conjectured bit data as the true bit data, when the concordance ratio is equal to or larger than 63%.

17. A system for recognizing ID marks, the system comprising:
   a reading unit configured to read each of the ID marks appended on a plurality base materials, and to convert the ID marks into bit data, respectively;
   an error correction unit configured to correct the converted bit data into normal bit data when deterioration of the ID mark is within an error correction ability, and to specify the converted bit data as damaged data, when the deterioration of the ID mark is beyond the error correction ability;
   a host computer having a sampling unit configured to sample candidate original data among original bit data of the ID marks, by identifying the converted bit data with one of the original bit data, each of the candidate original data being original bit data that is not identified by the converted bit data;
   a comparator configured to compare bit by bit candidate original data with each of the damaged data, to calculate concordance ratios between the candidate original data and the damaged data and to conjecture one of candidate original data having the highest concordance ratio to subject damaged data as the conjectured bit data of the subject damaged data; and
   a judgement unit configured to judge whether the conjectured bit data can be adopted as true bit data for each of the subject damaged data,
   wherein the judgement unit adopts the conjectured bit data as the true bit data, when a difference between the highest concordance ratio and second highest concordance ratio is equal to or larger than 8%.

18. A system of for recognizing ID marks, the system comprising:
   a reading unit configured to read each of the ID marks appended on a plurality base materials, and to convert the ID marks into bit data, respectively;
   an error correction unit configured to correct the converted bit data into normal bit data when deterioration of the ID mark is within an error correction ability, and to specify the converted bit data as damaged data, when the deterioration of the ID mark is beyond the error correction ability;
   a host computer having a sampling unit configured to sample candidate original data among original bit data of the ID marks, by identifying the converted bit data with one of the original bit data, each of the candidate original data being original bit data that is not identified by the converted bit data;
   a comparator configured to compare bit by bit candidate original data with each of the damaged data, to calculate concordance ratios between the candidate original data and the damaged data and to conjecture one of candidate original data having the highest concordance ratio to subject damaged data as the conjectured bit data of the subject damaged data; and
   a judgement unit configured to judge whether the conjectured bit data can be adopted as true bit data for each of the subject damaged data,
   wherein the judgement unit adopts the conjectured bit data as the true bit data, when the number of base materials which have generated the damaged data is equal to or smaller than five.

19. A method of manufacturing products, the method comprising:
   appending respectively first ID marks on respective unprocessed sites on a plurality of base materials so as to identify each of the base materials;
   storing each of original bit data of the first ID marks appended on all of the base materials in a management data base of a host computer;
   executing a subject process on all of the base materials;
   reading all of the first ID marks appended on all of the base materials after the subject process, converting the first ID marks into bit data, respectively, sorting all of the base materials into normal and damaged groups, the normal group consisting of base materials to which normal ID marks are appended, identifying the converted bit data of each of the first ID marks of the normal ID mark with one of original bit data, as deterioration of the first normal ID mark is within an error correction ability, the damaged group consisting of base materials to which damaged ID marks are appended, specifying the converted bit data of each of the first ID marks of the damaged ID marks as damaged data, as the deterioration of the damaged ID mark is beyond the error correction ability, identifying each of the base materials of the damaged group, by comparing bit by bit candidate original data with each of the damaged data of the damaged ID marks of the damaged group and calculating, mark by mark, concordance ratios between the candidate original data and the damaged data, each of the candidate original data being original bit data that is not identified by the converted bit data, and conjecturing an ID mark having one of candidate original data as a damaged ID mark having conjectured bit data for each of the damaged data under a paramount-criterion, which conjectures candidate original data having the highest concordance ratio to subject damaged data as the conjectured bit data of the subject damaged data; and generating a second ID mark based upon the conjectured bit data and appending the second ID mark adjacent to the first ID mark on the damaged base material; and executing a next process of the subject process on all of the base materials.

20. The method of claim 19, further comprising:

judging whether the conjectured bit data can be adopted as true bit data for each of the damaged data of the damaged group under a subsidiary-criterion, which is different from the paramount-criterion.

* * * * *